(12) United States Patent
Park et al.

(10) Patent No.: US 11,616,092 B2
(45) Date of Patent: Mar. 28, 2023

(54) IMAGE SENSORS AND ELECTRONIC DEVICES

(71) Applicant: Samsung Electronics Co., Ltd., Suwon-si (KR)

(72) Inventors: Kyung Bae Park, Hwaseong-si (KR); Yong Wan Jin, Seoul (KR); Sung Young Yun, Suwon-si (KR); Sung Jun Park, Yongin-si (KR); Feifei Fang, Suwon-si (KR); Chui Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 17/097,329

(22) Filed: Nov. 13, 2020

(65) Prior Publication Data

US 2021/0242271 A1 Aug. 5, 2021

(30) Foreign Application Priority Data

Jan. 31, 2020 (KR) .................. 10-2020-0012101

(51) Int. Cl.
*H01L 27/146* (2006.01)
*H01L 31/0352* (2006.01)

(52) U.S. Cl.
CPC .......... *H01L 27/14647* (2013.01); *H01L 31/035209* (2013.01)

(58) Field of Classification Search
CPC ....... H01L 27/14647; H01L 31/035209; H01L 27/307; H01L 27/14652; H01L 27/14605;
(Continued)

(56) References Cited

U.S. PATENT DOCUMENTS

| 7,535,073 B2 | 5/2009 | Ezaki |
| 7,968,923 B2 | 6/2011 | Nagaraja et al. |

(Continued)

FOREIGN PATENT DOCUMENTS

| EP | 3171407 A1 | 5/2017 |
| JP | 2006-073731 A | 3/2006 |

(Continued)

OTHER PUBLICATIONS

Extended European Search Report dated Apr. 30, 2021 for corresponding European Application No. 20206719.5.

*Primary Examiner* — Abdelaaziz Tissire
(74) *Attorney, Agent, or Firm* — Harness, Dickey & Pierce, P.L.C.

(57) ABSTRACT

An image sensor may include a first photo-sensing device on a semiconductor substrate and configured to sense light of a first wavelength spectrum, and second and third photo-sensing devices integrated in the semiconductor substrate and configured to sense light of a second and third wavelength spectrum, respectively. The first photo-sensing device may overlap each of the second and third photo-sensing devices in a thickness direction of the semiconductor substrate. The second and third photo-sensing devices do not overlap in the thickness direction and each have an upper surface, a lower surface, and a doped region therebetween. The third photo-sensing device includes an upper surface deeper further from the upper surface of the semiconductor substrate than the upper surface of the second photo-sensing device and a doped region thicker than the doped region of the second photo-sensing device. The image sensor may omit the first photo-sensing device.

27 Claims, 6 Drawing Sheets

(58) Field of Classification Search
CPC .......... H01L 27/1461; H01L 27/14698; H01L 27/14603; H01L 27/14683; H04N 5/335
See application file for complete search history.

(56) References Cited

U.S. PATENT DOCUMENTS

| | | |
|---|---|---|
| 8,063,461 B2 | 11/2011 | Ezaki |
| 8,258,560 B1 | 9/2012 | Hynecek |
| 9,202,839 B2 | 12/2015 | Miyanami |
| 9,419,035 B2 | 8/2016 | Wu et al. |
| 9,761,627 B2 | 9/2017 | Jin et al. |
| 10,388,701 B2 | 8/2019 | Roh et al. |
| 2008/0292298 A1* | 11/2008 | Hirai ............... H04N 5/3532 348/E5.045 |
| 2010/0327384 A1 | 12/2010 | Tomoda |
| 2016/0111651 A1* | 4/2016 | Yun ............... H01L 51/0078 257/40 |
| 2017/0141149 A1* | 5/2017 | Lee ............... H01L 27/14647 |
| 2018/0204865 A1* | 7/2018 | Murata ........... H01L 27/14621 |
| 2018/0331143 A1* | 11/2018 | Jin ............... H04N 1/00 |
| 2019/0319062 A1 | 10/2019 | Lee et al. |

FOREIGN PATENT DOCUMENTS

| | | |
|---|---|---|
| JP | 4507769 B2 | 7/2010 |
| KR | 10-2017-0022177 A | 3/2017 |

\* cited by examiner

IMAGE SENSORS AND ELECTRONIC DEVICES

CROSS-REFERENCE TO RELATED APPLICATION

This application claims priority to and the benefit of Korean Patent Application No. 10-2020-0012101 filed in the Korean Intellectual Property Office on Jan. 31, 2020, the entire contents of which are incorporated herein by reference.

BACKGROUND

1. Field

Image sensors and electronic devices are disclosed.

2. Description of the Related Art

An imaging device such as a camera includes an imaging device that captures images and stores said images as electrical signals. An imaging device may include an image sensor that may separate incident light into separate components according to wavelength and convert each separate component to a separate electrical signal.

SUMMARY

Some example embodiments provide image sensors capable of improving sensitivity and color separation characteristics, and increasing reliability while simplifying a process and reducing a manufacturing cost.

Some example embodiments provide electronic devices including one or more of said image sensors.

According to some example embodiments, an image sensor may include a first photo-sensing device on a semiconductor substrate. The first photo-sensing device may be configured to sense light in a first wavelength spectrum associated with a first color. The image sensor may include a second photo-sensing device integrated in the semiconductor substrate. The second photo-sensing device may be configured to sense light of in a second wavelength spectrum associated with a second color. The image sensor may include a third photo-sensing device integrated in the semiconductor substrate. The third photo-sensing device may be configured to sense light in a third wavelength spectrum associated with a third color. The first photo-sensing device and the second photo-sensing device may be overlapped with each other in a thickness direction of the semiconductor substrate, the thickness direction being perpendicular to an upper surface of the semiconductor substrate. The first photo-sensing device and the third photo-sensing device may be overlapped with each other in the thickness direction. The second photo-sensing device and the third photo-sensing device may be not overlapped with each other in the thickness direction. The second photo-sensing device and the third photo-sensing device may each include an upper surface that is proximate to the upper surface of the semiconductor substrate, a lower surface facing the upper surface and distal from the upper surface of the semiconductor substrate, and a doped region between the upper surface and the lower surface. The upper surface of the third photo-sensing device may be distal from the upper surface of the semiconductor substrate in relation to the upper surface of the second photo-sensing device. The doped region of the third photo-sensing device may be thicker, in the thickness direction, than the doped region of the second photo-sensing device.

The image sensor may not include any color filter.

The image sensor may further include an insulation layer between the semiconductor substrate and the first photo-sensing device.

The upper surface of the third photo-sensing device may be distal from the upper surface of the semiconductor substrate in relation to the upper surface of the second photo-sensing device by a distance that is equal to or greater than about 300 nm.

The upper surface of the second photo-sensing device may be at a depth of about 0 nm to about 200 nm from the upper surface of the semiconductor substrate in the thickness direction.

A wavelength selectivity of the third wavelength spectrum relative to the second wavelength spectrum of the third photo-sensing device may vary depending on a depth of the upper surface of the third photo-sensing device from the upper surface of the semiconductor substrate in the thickness direction. The depth of the upper surface of the third photo-sensing device from the upper surface of the semiconductor substrate in the thickness direction may be a depth $D_3$ that satisfies Relationship Equation 1:

$$EQE(\lambda_3) \geq 3 \times EQE(\lambda_2) \quad \text{[Relationship Equation 1]}$$

wherein, in Relationship Equation 1, EQE ($\lambda_3$) is external quantum efficiency at a wavelength ($\lambda_3$) included in the third wavelength spectrum of the third photo-sensing device based on the depth of the upper surface of the third photo-sensing device in the semiconductor substrate being the depth $D_3$, and EQE ($\lambda_2$) is external quantum efficiency at a wavelength ($\lambda_2$) included in the second wavelength spectrum of the third photo-sensing device based on the depth of the upper surface of the third photo-sensing device in the semiconductor substrate being the depth $D_3$.

The depth of the upper surface of the third photo-sensing device from the upper surface of the semiconductor substrate in the thickness direction may be about 400 nm to about 1 μm.

The doped region of the third photo-sensing device may be about 1.5 times to about 5 times thicker, in the thickness direction, than the doped region of the second photo-sensing device.

An external quantum efficiency at a wavelength included in the third wavelength spectrum of the third photo-sensing device may be different based on a thickness, in the thickness direction, of the doped region of the third photo-sensing device. The thickness of the doped region of the third photo-sensing device may satisfy Relationship Equation 2:

$$2.5 \times EQE(T_3) \geq EQE(T_2) \quad \text{[Relationship Equation 2]}$$

wherein, in Relationship Equation 2, EQE ($T_3$) is external quantum efficiency at a wavelength included in the third wavelength spectrum based on the thickness of the doped region of the third photo-sensing device in the thickness direction being a thickness $T_3$, EQE ($T_2$) is external quantum efficiency at a wavelength included in the second wavelength spectrum based on the thickness of the doped region of the second photo-sensing device in the thickness direction being a thickness $T_2$, and $T_3 > T_2$.

The thickness $T_3$ may be greater than or equal to about 1 μm.

The thickness $T_2$ may be about 200 nm to about 800 nm.

The thickness $T_3$ may be about 1 μm to about 3 μm, and the thickness $T_2$ may be about 300 nm to about 700 nm.

An external quantum efficiency at a wavelength included in the second wavelength spectrum of the second photo-sensing device may be about 1.1 times to about 2.5 times higher than an external quantum efficiency at a wavelength included in the third wavelength spectrum of the third photo-sensing device.

Differences among external quantum efficiency of the image sensor at a wavelength included in the first wavelength spectrum, external quantum efficiency of the image sensor at a wavelength included in the second wavelength spectrum, and external quantum efficiency of the image sensor at a wavelength included in the third wavelength spectrum may be less than or equal to about 50%.

The third wavelength spectrum may include longer wavelengths than the second wavelength spectrum.

The first color may be green, the second color may be blue, and the third color may be red.

The first photo-sensing device may include a first electrode and a second electrode facing each other, and a photoelectric conversion layer between the first electrode and the second electrode.

The image sensor may further include an insulation layer between the semiconductor substrate and the first photo-sensing device, and the first electrode is integrated in the insulation layer.

The first photo-sensing device may further include a buffer layer between the first electrode and the photoelectric conversion layer or between the second electrode and the photoelectric conversion layer. The buffer layer may include a lanthanide element, calcium (Ca), potassium (K), aluminum (Al), or an alloy thereof.

An electronic device may include the image sensor.

According to some example embodiments, an image sensor may include a first photo-sensing device integrated in a semiconductor substrate. The first photo-sensing device may be configured to sense light of a first wavelength spectrum associated. The image sensor may include a second photo-sensing device integrated in the semiconductor substrate. The second photo-sensing device may be configured to sense light of a second wavelength spectrum. The first photo-sensing device and the second photo-sensing device may be not overlapped with each other in a thickness direction extending perpendicular to an upper surface of the semiconductor substrate and may be spaced apart from each other in a surface direction extending parallel to the upper surface of the semiconductor substrate. The first photo-sensing device and the second photo-sensing device may each include an upper surface that is proximate to the upper surface of the semiconductor substrate, a lower surface facing the upper surface and distal from the upper surface of the semiconductor substrate, and a doped region between the upper surface and the lower surface. The second photo-sensing device may have at least one of the upper surface of the second photo-sensing device being distal from the upper surface of the semiconductor substrate in relation to the upper surface of the first photo-sensing device, or the doped region of the second photo-sensing device being thicker, in the thickness direction, than the doped region of the first photo-sensing device.

The image sensor may further include a third photo-sensing device on the semiconductor substrate. The third photo-sensing device may be configured to sense light of a third wavelength spectrum. The third photo-sensing device may be overlapped with at least one of the first photo-sensing device or the second photo-sensing device in the thickness direction.

The third photo-sensing device may be overlapped with the first photo-sensing device in the thickness direction. The third photo-sensing device may be overlapped with the second photo-sensing device in the thickness direction.

The image sensor may further include a fourth photo-sensing device on the semiconductor substrate. The fourth photo-sensing device may be configured to sense light of a fourth wavelength spectrum. The fourth photo-sensing device may overlap with the third photo-sensing device in the surface direction. The third photo-sensing device may be overlapped with the first photo-sensing device and may be not overlapped with the second photo-sensing device in the thickness direction. The fourth photo-sensing device may be overlapped with the second photo-sensing device and may be not overlapped with the first photo-sensing device in the thickness direction.

The first photo-sensing device and the second photo-sensing device may be at least partially overlapped with each other in the surface direction, such that the lower surface of the first photo-sensing device is equidistant or distal from the upper surface of the semiconductor substrate in relation to the upper surface of the second photo-sensing device.

The first photo-sensing device and the second photo-sensing device may be not overlapped with each other in the surface direction, such that the lower surface of the first photo-sensing device is proximate to the upper surface of the semiconductor substrate in relation to the upper surface of the second photo-sensing device.

The image sensor may not include any color filter.

An electronic device may include the image sensor.

The process of image sensors may be simplified manufacturing costs may be reduced, while improving sensitivity and color separation characteristics and increasing reliability.

DETAILED DESCRIPTION

Figure 1:
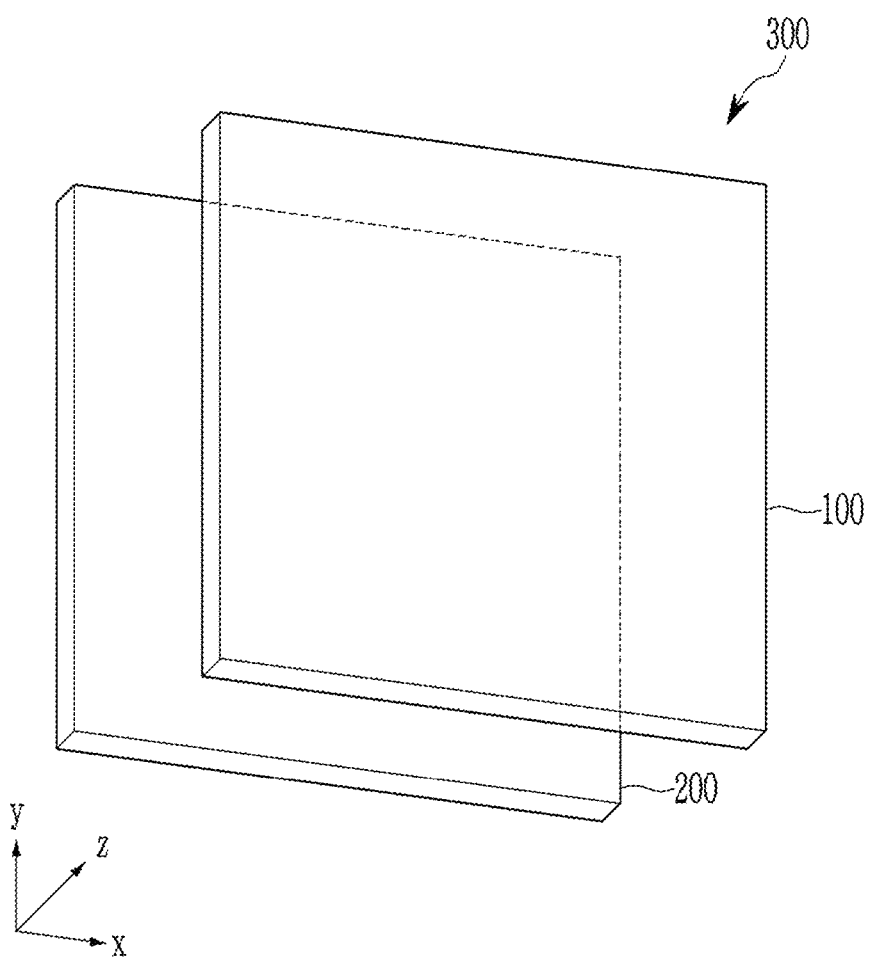
FIG. 1 is a top plan view showing an example of a stacked structure of an image sensor according to some example embodiments.

Hereinafter, example embodiments are described in detail so that those skilled in the art can easily implement them. However, the actual applied structure may be implemented in various different forms and is not limited to the example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present. Additionally, when an element is referred to as being "on" another element, the element may be above or beneath the other element.

In the drawings, parts having no relationship with the description are omitted for clarity, and the same or similar constituent elements are indicated by the same reference numeral throughout the specification.

Hereinafter, the terms "lower portion" and "upper portion" are for convenience of description and do not limit the positional relationship.

Hereinafter, the upper portion of the image sensor is described as a light-receiving side, but this is for convenience of description and does not limit the positional relationship.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, when a definition is not otherwise provided, "hetero" refers to inclusion of one or four heteroatoms selected from N, O, S, Se, Te, Si, and P.

Hereinafter, "combination" refers to a mixture or a stacked structure of two or more.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a work function or energy level is expressed as an absolute value from a vacuum level. Also, a deep, high or large work function or energy level means that the absolute values are large with reference to a vacuum level of "0 eV" and shallow, low or small work function or energy level means that the absolute values are small with reference to a vacuum level of "0 eV."

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, image sensors according to some example embodiments are described.

Figure 2:
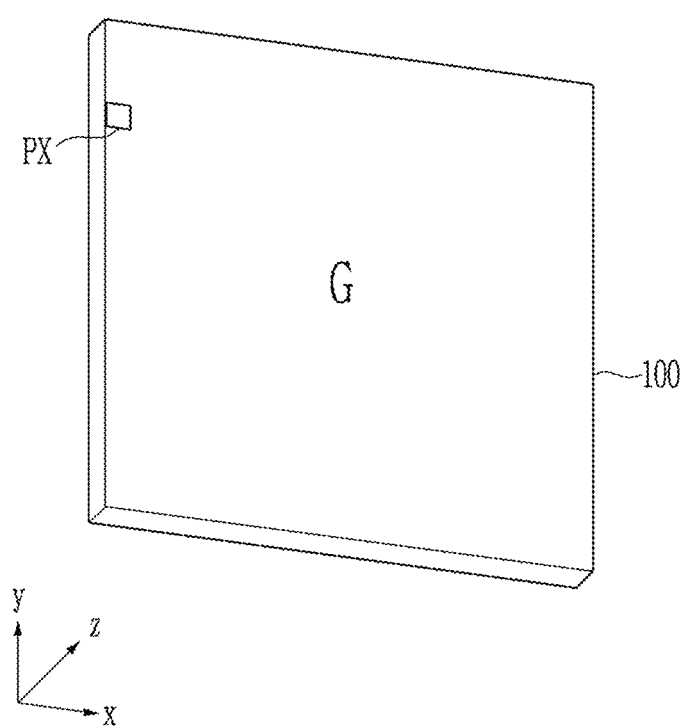
FIG. 2 is a top plan view showing an example of a photo-sensing device disposed at an upper portion in the stacked structure of the image sensor of FIG. 1.
Figure 3:
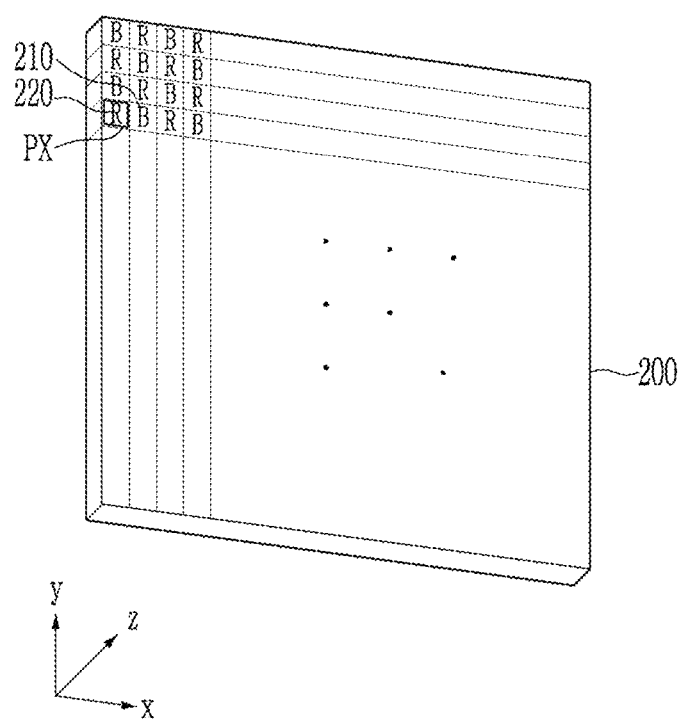
FIG. 3 is a plan view showing an example of an arrangement of photo-sensing devices integrated in a semiconductor substrate disposed at a lower portion in the stacked structure of the image sensor of FIG. 1.
Figure 4A:
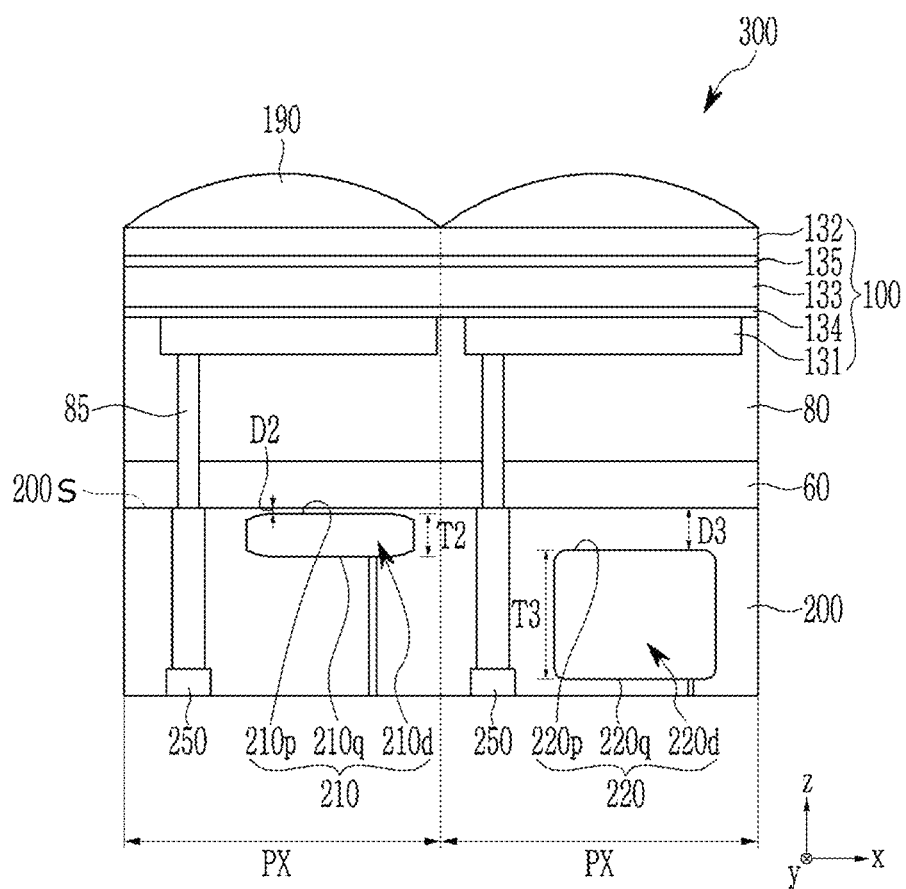
FIG. 4A is a schematic cross-sectional view showing an example of the image sensor of FIG. 1.
Figure 4B:
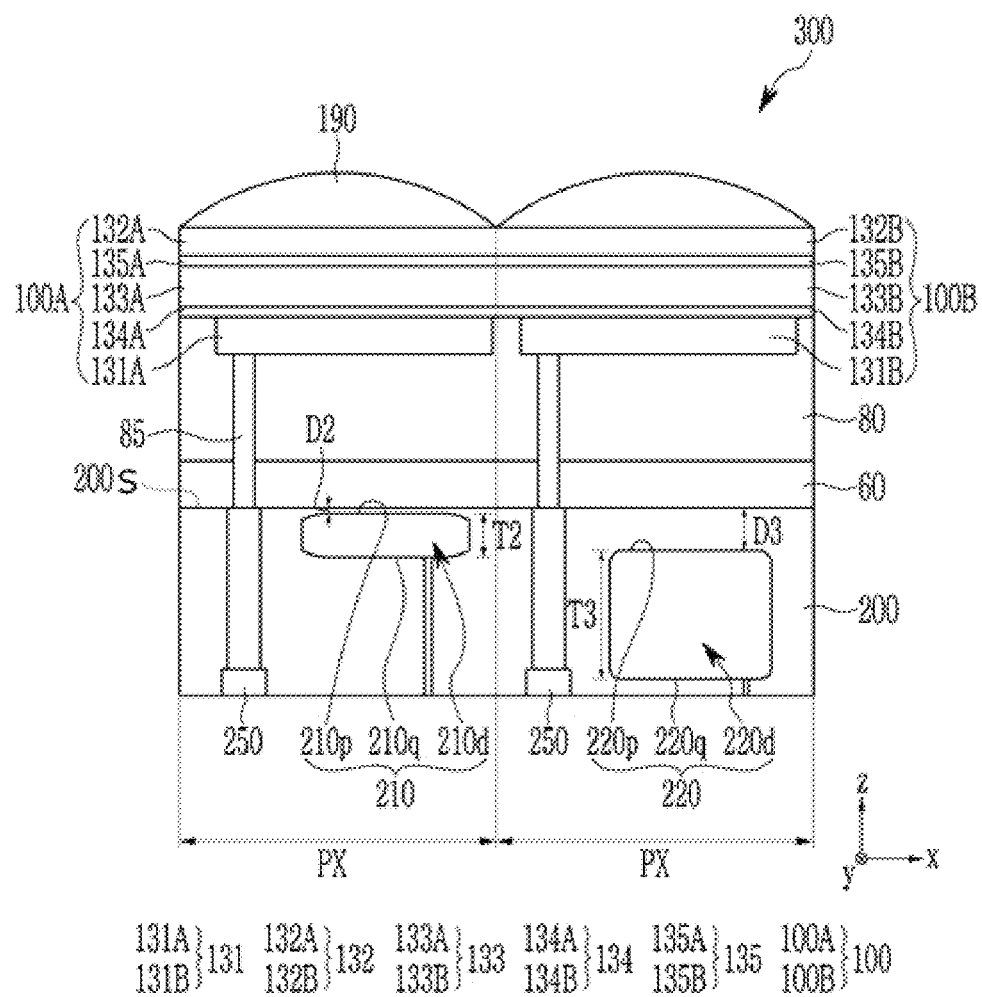
FIG. 4B is a schematic cross-sectional view showing an example of the image sensor of FIG. 1.

FIG. 1 is a top plan view showing an example of a stacked structure of an image sensor according to some example embodiments, FIG. 2 is a top plan view showing an example of a photo-sensing device disposed at an upper portion in the stacked structure of the image sensor of FIG. 1, FIG. 3 is a plan view showing an example of an arrangement of photo-sensing devices integrated in a semiconductor substrate at a lower portion in the stacked structure of the image sensor of FIG. 1, FIG. 4A is a schematic cross-sectional view showing an example of the image sensor of FIG. 1, and FIG. 4B is a schematic cross-sectional view showing an example of the image sensor of FIG. 1.

Referring to FIGS. 1 to 4B, the image sensor 300 according to some example embodiments is a stack-type image sensor in which the first photo-sensing device 100 and the semiconductor substrate 200 are stacked with respect to each other.

The first photo-sensing device 100 may be a photoelectric conversion device configured to absorb light in a particular (or, alternatively, predetermined) wavelength spectrum and photoelectrically convert the absorbed light into an electric signal. Such absorbing and photoelectric conversion of absorbed light may be referred to herein as "sensing" said light, and thus it will be understood that the first photo-sensing device 100 may be configured to sense light in the particular wavelength spectrum. The first photo-sensing device 100 may be disposed at a side where light is incident, that is, a whole surface of a light-receiving surface, and may be configured to selectively absorb light of (e.g., light in) a first wavelength spectrum, which may include a wavelength spectrum of a first color, also referred to herein as a wavelength spectrum associated with a first color, to perform photoelectric conversion. Thus, the first photo-sensing device 100 may be configured to sense (e.g., selectively sense) the light of the first wavelength spectrum (e.g., the wavelength spectrum of the first color). The wavelength spectrum of the first color may be a wavelength spectrum that is a portion of a visible light spectrum, but example embodiments are not limited thereto. Any descriptions herein to the wavelength spectrum of the first color may be applied interchangeably to the first wavelength spectrum. The light in the wavelength spectrum of the first color may be one of three primary colors. In some example embodiments, the light in the wavelength spectrum of the first color is light in a blue wavelength spectrum (hereinafter referred to as "blue light"), light in a green wavelength spectrum (hereinafter referred to as "green light"), or light in a red wavelength spectrum (hereinafter referred to as "red light"). In some example embodiments, the light of the wavelength spectrum of the first color may be green light or red light. In some example embodiments, the light of the wavelength spectrum of the first color may be green light. In some example embodiments, the photo-sensing device 100 may be configured to selectively absorb and photoelectrically convert (e.g., "sense") light of a first wavelength spectrum that may be a visible wavelength spectrum (e.g., a wavelength spectrum of a first color, also referred to as a first visible wavelength spectrum, such as blue light, green light, red light, or any combination thereof), a non-visible wavelength spectrum (e.g., an infrared wavelength spectrum and/or an ultraviolet wavelength spectrum), or any combination thereof.

Herein, the selective absorption of blue light, green light, or red light means that each maximum absorption wavelength ($\lambda_{max}$) of the absorption spectrum is present in greater than or equal to about 380 nm and less than 500 nm, about 500 nm to about 600 nm, or greater than about 600 nm and less than or equal to about 700 nm, and that the absorption spectrum in the corresponding wavelength spectrum is significantly higher than the absorption spectrum in other wavelength spectra. Herein, the "significantly higher" means that, in some example embodiments, about 70% to about 100%, about 75% to about 100%, about 80% to about 100%, about 85% to about 100%, about 90% to about 100%, or about 95% to about 100% of a total area of the absorption spectrum belongs to the corresponding wavelength spectrum.

The first photo-sensing device 100 includes a lower electrode 131 and an upper electrode 132 facing each other, a photoelectric conversion layer 133 between the lower electrode 131 and the upper electrode 132, and optionally buffer layers 134 and 135 (e.g., one or both of the buffer layers 134 or 135 may be omitted from the first photo-sensing device 100).

One of the lower electrode 131 or the upper electrode 132 is an anode, and the other is a cathode. In some example embodiments, the lower electrode 131 may be an anode and the upper electrode 132 may be a cathode. In some example embodiments, the lower electrode 131 may be a cathode and the upper electrode 132 may be an anode. Either of the lower electrode 131 or the upper electrode 132 may be referred to herein as a first electrode, and the other of the lower electrode 131 or the upper electrode 132 may be referred to herein as a second electrode.

The lower electrode 131 and the upper electrode 132 may be transparent electrodes, respectively. The transparent electrode may have a transmittance of greater than or equal to about 80%, for example, greater than or equal to about 85%, greater than or equal to about 88%, or greater than or equal to about 90%. The transparent electrode may include at least one of an oxide conductor, a carbon conductor, or a metal thin film. In some example embodiments, the oxide conductor may include at least one selected from indium tin oxide (ITO), indium zinc oxide (IZO), zinc tin oxide (ZTO), aluminum tin oxide (ATO), and aluminum zinc oxide (AZO), the carbon conductor may be at least one selected from graphene and carbon nanoparticles, and the metal thin film may be an ultrathin film including aluminum (Al), magnesium (Mg), silver (Ag), gold (Au), an alloy thereof, or a combination thereof. The upper electrode 132 may be a light-receiving electrode.

The photoelectric conversion layer 133 may be configured to selectively absorb light of a wavelength spectrum of a first color (e.g., light in a first wavelength spectrum that is associated with a first color) that may be a portion of the visible light spectrum and to convert the absorbed light into an electrical signal (e.g., to selectively sense said light). The photoelectric conversion layer 133 may be configured to transmit the remaining light except for the wavelength spectrum of the first color (e.g., selectively transmit the light that is not the absorbed light of the wavelength spectrum of a first color). The light of the wavelength spectrum of the first color may be, in some example embodiments, blue light, green light, or red light. In some example embodiments, the light of the wavelength spectrum of the first color may be green light or red light. In some example embodiments, the light of the wavelength spectrum of the first color may be green light.

In the photoelectric conversion layer 133, at least one p-type semiconductor and at least one n-type semiconductor may form a pn junction, and may generate excitons after receiving light from the outside (e.g., light of the wavelength spectrum of the first color) to generate excitons. The generated excitons may be separated into holes and electrons.

Each of the p-type semiconductor and the n-type semiconductor may be a light-absorbing material, and in some example embodiments, at least one of the p-type semiconductor or the n-type semiconductor may be an organic light-absorbing material. In some example embodiments, at least one of the p-type semiconductor or the n-type semiconductor may be a wavelength-selective light-absorbing material configured to selectively absorb light of a wavelength spectrum of a first color. In some example embodiments, at least one of the p-type semiconductor or the n-type semiconductor may be a wavelength-selective organic light-absorbing material. The p-type semiconductor and the n-type semiconductor may have a peak absorption wavelength ($\lambda_{max}$) in the same or different wavelength spectrum.

In some example embodiments, at least one of the p-type semiconductor or the n-type semiconductor may be a green light-absorbing material having a maximum absorption wavelength ($\lambda_{max}$) in the wavelength spectrum of about 500 nm to about 600 nm, in some example embodiments, a green light-absorbing material having a maximum absorption wavelength ($\lambda_{max}$) in the wavelength spectrum of about 520 nm to about 580 nm.

In some example embodiments, at least one of the p-type semiconductor or the n-type semiconductor may be an organic green light-absorbing material having a maximum absorption wavelength ($\lambda_{max}$) in a wavelength spectrum of about 500 nm to about 600 nm, in some example embodiments, an organic green light-absorbing material having a maximum absorption wavelength ($\lambda_{max}$) in a wavelength spectrum of about 520 nm to about 580 nm.

In some example embodiments, the p-type semiconductor may be an organic green light-absorbing material having a maximum absorption wavelength ($\lambda_{max}$) in a wavelength spectrum of about 500 nm to about 600 nm, in some example embodiments, an organic green light-absorbing material having a maximum absorption wavelength ($\lambda_{max}$) in a wavelength spectrum of about 520 nm to about 580 nm.

In some example embodiments, a HOMO energy level of the p-type semiconductor may be about 5.0 eV to about 6.0 eV, and within the range, about 5.1 eV to about 5.9 eV, about 5.2 eV to about 5.8 eV, or about 5.3 eV to about 5.8 eV. In some example embodiments, a LUMO energy level of the p-type semiconductor may be about 2.7 eV to about 4.3 eV, and within the range, about 2.8 eV to about 4.1 eV or about 3.0 eV to about 4.0 eV. In some example embodiments, an energy band gap of the p-type semiconductor may be about 1.7 eV to about 2.3 eV, and within the range, about 1.8 eV to about 2.2 eV or about 1.9 eV to about 2.1 eV.

In some example embodiments, the p-type semiconductor may be an organic material having a core structure including an electron donating moiety (EDM), a π-conjugated linking moiety (LM), and an electron accepting moiety (EMA).

In some example embodiments, the p-type semiconductor may be represented by Chemical Formula A, but is not limited thereto.

EDM-LM-EAM     [Chemical Formula A]

In Chemical Formula A,

EDM may be an electron donating moiety,

EAM may be an electron accepting moiety, and

LM may be a π-conjugated linking moiety that links the electron donating moiety with the electron accepting moiety.

In some example embodiments, the p-type semiconductor represented by Chemical Formula A may be, in some example embodiments, represented by Chemical Formula A-1.

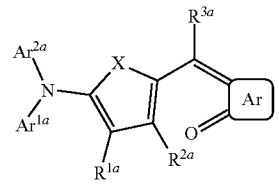

[Chemical Formula A-1]

In Chemical Formula A-1,

X may be O, S, Se, Te, SO, SO$_2$, or SiR$^a$R$^b$,

Ar may be a substituted or unsubstituted C6 to C30 arylene group, a substituted or unsubstituted C3 to C30 heterocyclic group, or a fused ring of the foregoing two or more, Ar$^{1a}$ and Ar$^{2a}$ may independently be a substituted or unsubstituted C6 to C30 aryl group, a substituted or unsubstituted C3 to C30 heteroaryl group, or a combination thereof, R$^{1a}$ to R$^{3a}$, R$^a$, and R$^b$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and R$^{1a}$ to R$^{3a}$ and Ar$^{1a}$ and Ar$^{2a}$ may independently be present or two adjacent groups may be combined with each other to form a fused ring.

In some example embodiments, in Chemical Formula A-1, Ar$^{1a}$ and Ar$^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

In some example embodiments, Ar$^{1a}$ and Ar$^{2a}$ of Chemical Formula A-1 may be linked to each other to form a ring or in some example embodiments, Ar$^{1a}$ and Ar$^{2a}$ may be linked to each other by one of a single bond, —(CR$^g$R$^h$)$_{n2}$— (n2 is 1 or 2), —O—, —S—, —Se—, —N=, —NR$^i$—, —SiR$^j$R$^k$—, or —GeR$^l$R$^m$— to form a ring. Herein, R$^g$ to R$^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, a cyano group, or a combination thereof.

In some example embodiments, R$^{1a}$ and Ar$^{1a}$ of Chemical Formula A-1 may be fused to each other to form a ring. In some example embodiments, R$^{1a}$ and Ar$^{1a}$ may be linked to each other to form a ring by one of a single bond, —(CR$^g$R$^h$)$_{n2}$— (n2 is 1 or 2), —O—, —S—, —Se—, —N=, —NR$^i$—, —SiR$^j$R$^k$—, or —GeR$^l$R$^m$—. Herein, R$^g$ to R$^m$ are the same as described above.

In some example embodiments, the p-type semiconductor represented by Chemical Formula A-1 may be represented by one of Chemical Formulae A-2 to A-7.

[Chemical Formula A-2]

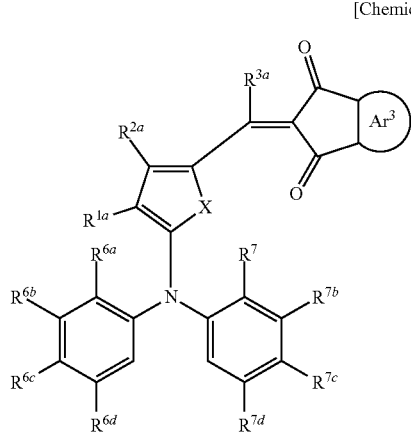

[Chemical Formula A-3]

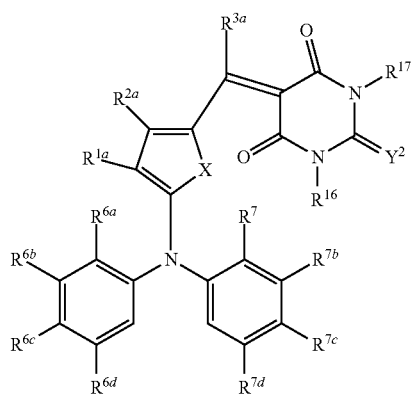

[Chemical Formula A-4]

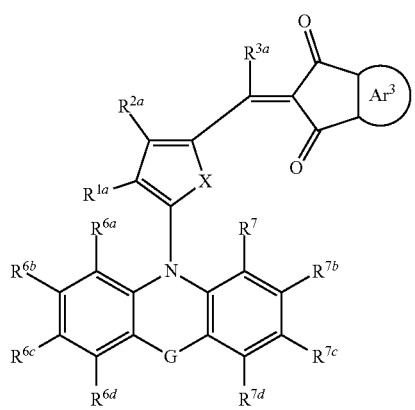

[Chemical Formula A-5]

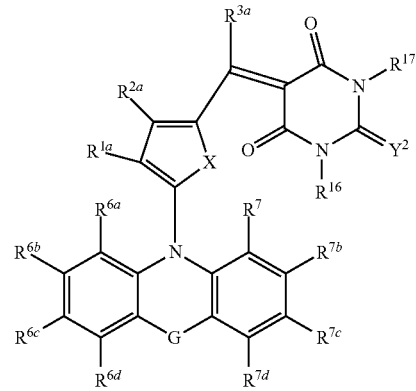

[Chemical Formula A-6]

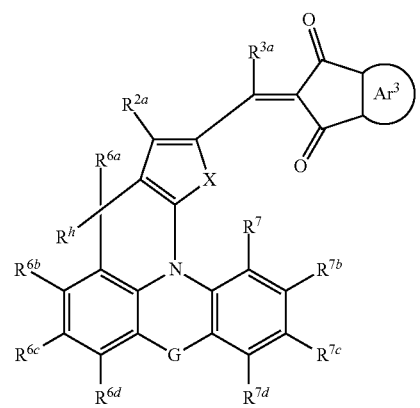

[Chemical Formula A-7]

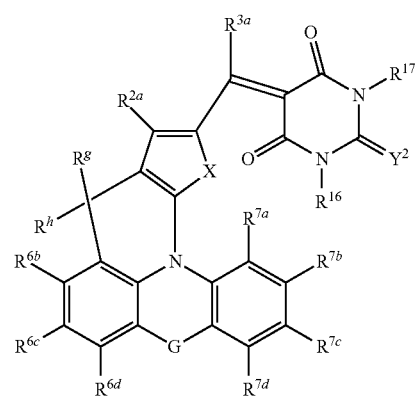

In Chemical Formulae A-2 to A-7,

X and $R^{1a}$ to $R^{3a}$ are the same as described above, $Ar^3$ may be a substituted or unsubstituted C6 to C30 arylene group, a substituted or unsubstituted C3 to C30 heterocyclic group, or a fused ring of the foregoing two or more, G may be one of a single bond, —(CR$^g$R$^h$)$_{n2}$— (n2 is 1 or 2), —O—, —S—, —Se—, —N=, —NR$^i$—, —SiR$^j$R$^k$—, or —GeR$^l$R$^m$—, wherein R$^g$ to R$^m$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and R$^g$ and R$^h$, R$^j$ and R$^k$, and R$^l$ and R$^m$ may independently be present alone or linked to each other to form a ring, Y$^2$ may be O, S, Se, Te, or C(R$^q$)(CN) (wherein R$^q$ is hydrogen, a cyano group (—CN), or a C1 to C10 alkyl group), R$^{6a}$ to R$^{6d}$, R$^7$, R$^{7a}$ to R$_{7d}$, R$^{16}$, R$^{17}$, R$^g$, and R$^h$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and R$^{1a}$ to R$^{3a}$, R$^{6a}$ to R$^{6d}$, R$^7$, and R$^{7a}$ to R$^{7d}$ may independently be present or two adjacent groups may be linked to each other to form a fused ring.

In some example embodiments, Ar$^3$ of Chemical Formulae A-2, A-4, and/or A-6 may be benzene, naphthylene, anthracene, thiophene, selenophene, tellurophene, pyridine, pyrimidine, or a fused ring of the foregoing two or more.

In some example embodiments, the n-type semiconductor may be an organic material, an inorganic material or organic/inorganic material.

In some example embodiments, the LUMO energy level of the n-type semiconductor may be about 3.6 eV to about 4.8 eV, and within the range, about 3.8 eV to about 4.6 eV, or about 3.9 eV to about 4.5 eV.

In some example embodiments, the n-type semiconductor may be, in some example embodiments, a thiophene or a thiophene derivative, a fullerene or a fullerene derivative, but is not limited thereto.

The photoelectric conversion layer 133 may be an intrinsic layer (I layer) in which a p-type semiconductor and an n-type semiconductor are blended in a bulk heterojunction form. Herein, the p-type semiconductor and the n-type semiconductor may be blended in a volume ratio (thickness ratio) of about 1:9 to about 9:1, and may be mixed within the range, in some example embodiments, in a volume ratio (thickness ratio) of about 2:8 to about 8:2, in a volume ratio (thickness ratio) of about 3:7 to about 7:3, in a volume ratio (thickness ratio) of about 4:6 to about 6:4, or in a volume ratio (thickness ratio) of about 5:5.

The photoelectric conversion layer 133 may include a bilayer including a p-type layer including the aforementioned p-type semiconductor and an n-type layer including the aforementioned n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 133 may further include a p-type layer and/or an n-type layer in addition to the intrinsic layer. The p-type layer may include the aforementioned p-type semiconductor and the n-type layer may include the aforementioned n-type semiconductor. In some example embodiments, the photoelectric conversion layer 133 may include in various combinations of p-type layer/I layer, I layer/n-type layer, p-type layer/I layer/n-type layer, and the like.

The photoelectric conversion layer 133 may be formed at the whole surface of the first photo-sensing device 100. Accordingly, the light of the wavelength spectrum of the first color may be selectively absorbed from the front surface of the first photo-sensing device 100 and the light area may be increased to provide high light absorption efficiency.

The photoelectric conversion layer 133 may have a thickness of about 1 nm to about 500 nm, within the range, a thickness of about 5 nm to about 300 nm. When the photoelectric conversion layer 133 has a thickness within the range, the active layer (e.g., photoelectric conversion layer 133) may be configured to effectively absorb light, effectively separate holes from electrons, and transfer holes and electrons, thereby effectively improving photoelectronic conversion efficiency.

The buffer layers 134 and 135 may be between the lower electrode 131 and the photoelectric conversion layer 133 and/or between the upper electrode 132 and the photoelectric conversion layer 133.

The buffer layers 134 and 135 may independently be a hole transport layer, a hole injection layer, a hole extraction layer, an electron blocking layer, an electron transport layer, an electron injection layer, an electron extraction layer, a hole blocking layer, or a combination thereof.

In some example embodiments, the buffer layers 134 and 135 may be configured to effectively transfer or extract first charges (e.g., holes or electrons) and second charges (e.g., electrons or holes) separated from the photoelectric conversion layer 133, respectively, to the lower electrode 131 and the upper electrode 132, respectively, while simultaneously prevent the second charges from being reversely injected or transferred from the lower electrode 131 to the photoelectric conversion layer 133 or the first charges from being reversely injected or transferred to the photoelectric conversion layer 133 from the upper electrode 132 when a voltage is applied from the outside. Accordingly, electrical characteristics of the first photo-sensing device 100 may be improved by increasing the photoelectric conversion efficiency of the first photo-sensing device 100 and at the same time effectively reducing dark current and remaining charge carriers.

One of the buffer layers 134 and 135 may be an organic buffer layer.

In some example embodiments, the organic buffer layer may be a compound represented by Chemical Formula B-1 or B-2.

[Chemical Formula B-1]

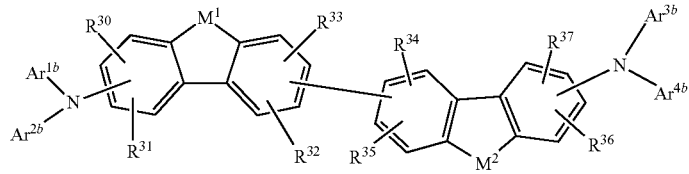

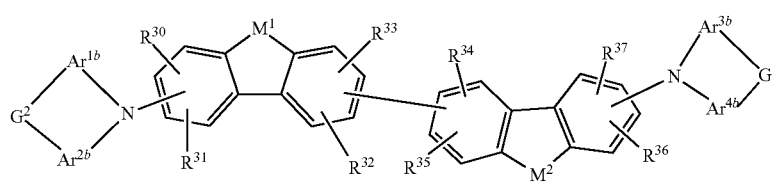

[Chemical Formula B-2]

In Chemical Formula B-1 or B-2, $M^1$ and $M^2$ may independently be $CR''R^o$, $SiR^pR^q$, $NR^r$, O, S, Se, or Te, $Ar^{1b}$, $Ar^{2b}$, $Ar^{3b}$, and $Ar^{4b}$ may independently be a substituted or unsubstituted C6 to C30 aryl group, a substituted or unsubstituted C3 to C30 heteroaryl group, or a combination thereof, $G^2$ and $G^3$ may independently be a single bond, $-(CR^sR^t)_{n3}-$, $-O-$, $-S-$, $-Se-$, $-N=$, $-NR^u-$, $-SiR^vR^w-$, or $-GeR^xR^y-$, wherein n3 is 1 or 2, and $R^{30}$ to $R^{37}$ and $R^n$ to $R^y$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The compound represented by Chemical Formula B-1 or B-2 may be, in some example embodiments, a compound represented by Chemical Formula B-3 or B-4.

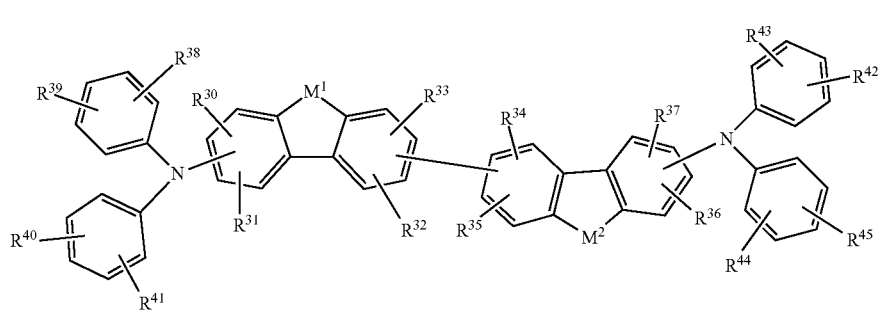

[Chemical Formula B-3]

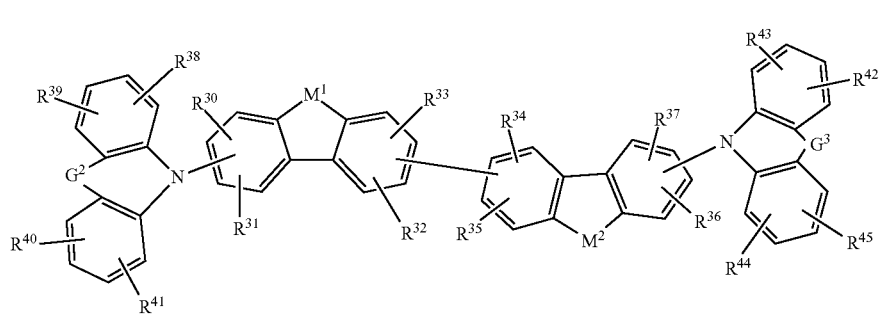

[Chemical Formula B-4]

In Chemical Formula B-3 or B-4, $M^1$, $M^2$, $G^2$, $G^3$, $R^{30}$ to $R^{37}$ are the same as described above, $R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or cyano group.

The compound represented by Chemical Formula B-3 or B-4 may be, in some example embodiments, a compound represented by Chemical Formula B-5 or B-6.

$1.5\times10^{-3}$ cm$^2$/Vs to about 10 cm$^2$/Vs, about $1.8\times10^{-3}$ cm$^2$/Vs to about 10 cm$^2$/Vs, about $2.0\times10^{-3}$ cm$^2$/Vs to about 10 cm$^2$/Vs, about $3.0\times10^{-3}$ cm$^2$/Vs to about 10 cm$^2$/Vs, about $4.0\times10^{-3}$ cm$^2$/Vs to about 10 cm$^2$/Vs, or about $5.0\times10^{-3}$ cm$^2$/Vs to about 10 cm$^2$/Vs.

In some example embodiments, the organic buffer layer may include a low-molecular weight organic semiconductor having an average molecular weight of less than or equal to about 3000. In some example embodiments, the organic buffer layer may include an aromatic compound and/or a heteroaromatic compound, in some example embodiments,

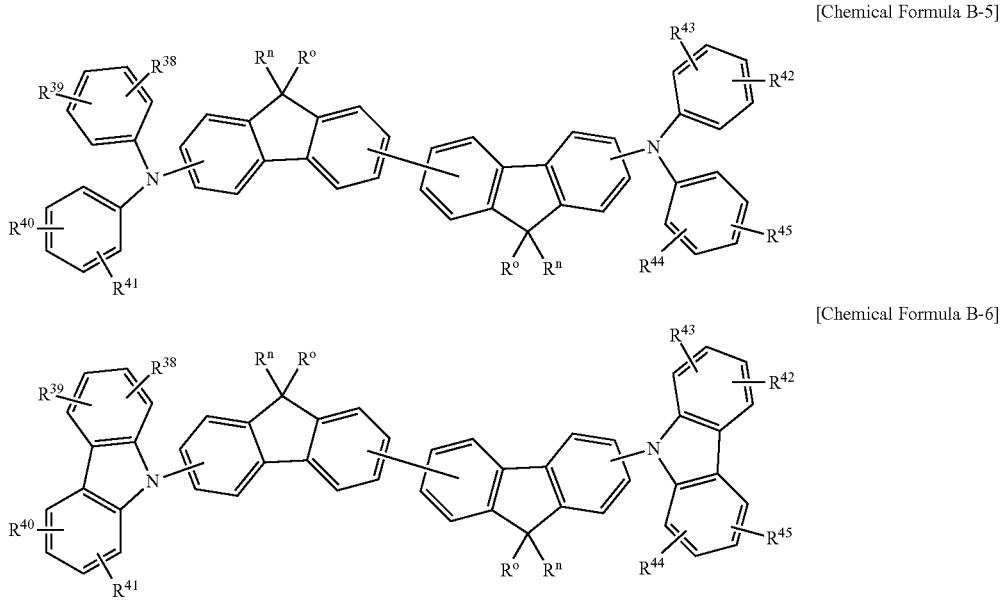

[Chemical Formula B-5]

[Chemical Formula B-6]

In Chemical Formula B-5 or B-6, $R^{38}$ to $R^{45}$ and $R^o$ and $R^n$ are the same as described above.

In some example embodiments, the organic buffer layer may include a low-molecular organic semiconductor or a polymer semiconductor having high charge carrier mobility, or a combination thereof, whereby charge mobility of the organic buffer layer is higher than charge mobility of the photoelectric conversion layer 133 described above. In some example embodiments, the charge carrier mobility of the organic buffer layer may be about 50 times or more, and within the range, about 70 times or more, about 80 times or more, about 100 times or more, about 120 times or more, about 150 times or more, about 200 times or more, about 300 times or more, about 500 times or more, about 800 times or more, or about 1000 times or more higher than the charge carrier mobility of the photoelectric conversion layer 133. In some example embodiments, the charge carrier mobility of the organic buffer layer may be greater than or equal to about $1.0\times10^{-3}$ cm$^2$/Vs, and within the range, in some example embodiments, greater than or equal to about $1.2\times10^{-3}$ cm$^2$/Vs, greater than or equal to about $1.5\times10^{-3}$ cm$^2$/Vs, greater than or equal to about $1.8\times10^{-3}$ cm$^2$/Vs, greater than or equal to about $2.0\times10^{-3}$ cm$^2$/Vs, greater than or equal to about $3.0\times10^{-3}$ cm$^2$/Vs, greater than or equal to about $4.0\times10^{-3}$ cm$^2$/Vs, or greater than or equal to about $5.0\times10^{-3}$ cm$^2$/Vs. In some example embodiments, the charge carrier mobility of the organic buffer layer may be about $1.0\times10^{-3}$ cm$^2$/Vs to about 10 cm$^2$/Vs, and within the range, for example about $1.2\times10^{-3}$ cm$^2$/Vs to about 10 cm$^2$/Vs, about a fused polycyclic aromatic compound, a fused polycyclic heteroaromatic compound, or a combination thereof. It may include, in some example embodiments, a fused polycyclic aromatic compound such as pentacene and/or a fused polycyclic heteroaromatic compound including at least one O, S, Se, Te, N, or a combination thereof, such as a fused polycyclic heteroaromatic compound including at least one O, S, Se, Te, or a combination thereof. In some example embodiments, the organic buffer layer may include a fused polycyclic aromatic compound and/or a fused polycyclic heteroaromatic compound having a compact planar structure in which four or more rings are fused to each other, such as a fused polycyclic aromatic compound and/or a fused polycyclic heteroaromatic compound in which 5, 6, 7, 8, 9, 10, 11 or 12 rings are fused. In some example embodiments, the organic buffer layer may include a fused polycyclic aromatic compound and/or a fused polycyclic heteroaromatic compound including at least one benzene ring. In some example embodiments, the organic buffer layer may be a fused polycyclic heteroaromatic compound including at least one thiophene, selenophene, and/or tellurophene.

In some example embodiments, the organic buffer layer may include a compound including a carbazole moiety, in some example embodiments, a compound including at least three carbazole moieties.

In some example embodiments, the organic buffer layer may include a compound represented by Chemical Formula C.

[Chemical Formula C]

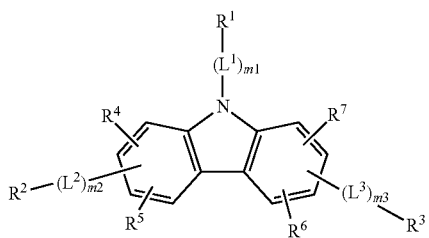

In Chemical Formula C,
$L^1$ to $L^3$ may independently be a substituted or unsubstituted C6 to C20 arylene group, $R^1$ to $R^7$ may independently be hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heteroaryl group, a substituted or unsubstituted carbazolyl group, a halogen, a cyano group, or a combination thereof, at least two of $R^1$ to $R^3$ may include a substituted or unsubstituted carbazolyl group, and $m_1$ to $m_3$ may independently be 0 or 1.

In some example embodiments, the organic buffer layer may include a compound represented by one of Chemical Formulae C-1 to C-3.

[Chemical Formula C-1]

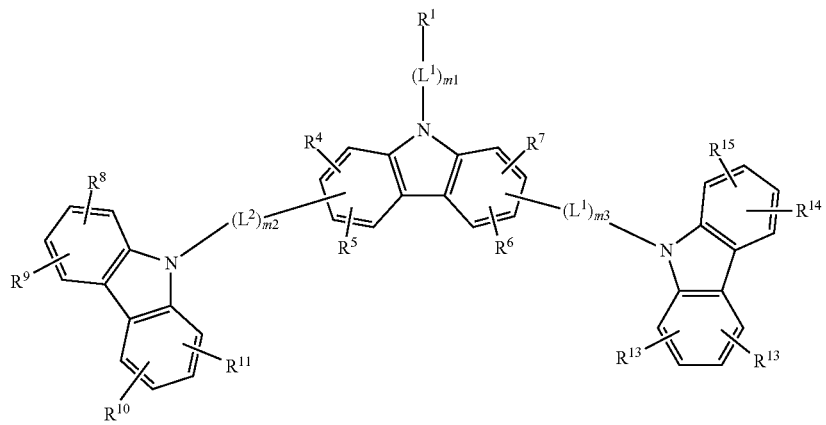

[Chemical Formula C-2]

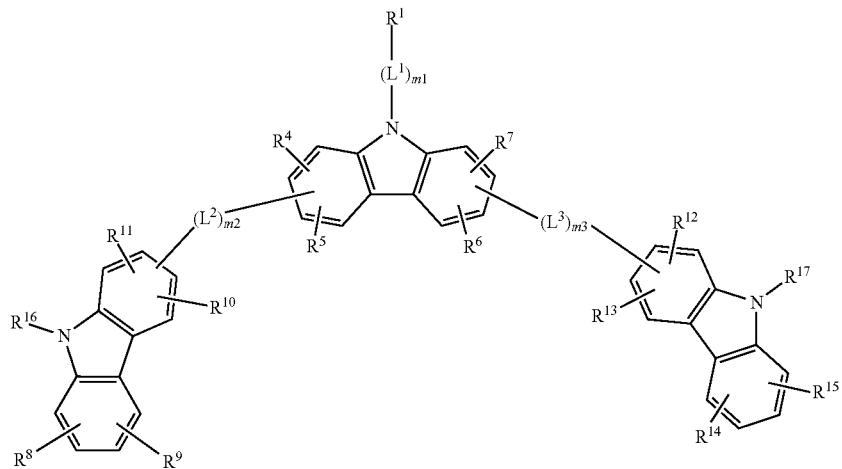

[Chemical Formula C-3]

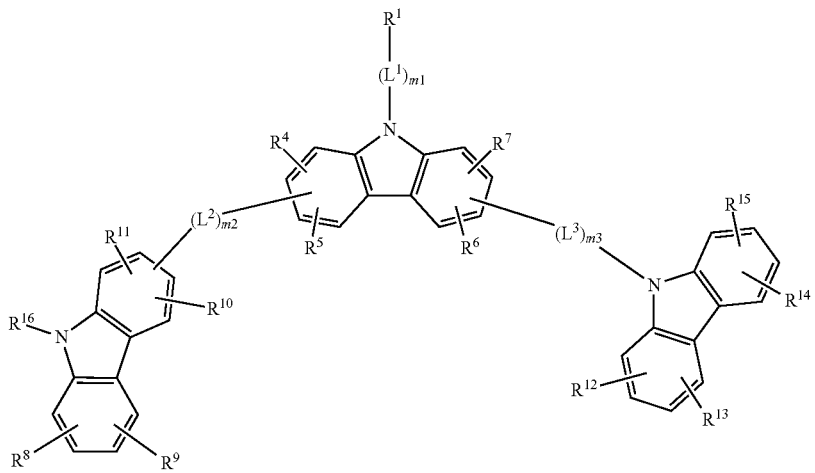

In Chemical Formulae C-1 to C-3, $L^1$ to $L^3$, $R^1$, $R^4$ to $R^7$, and $m_1$ to $m_3$ are the same as described above, $R^8$ to $R^{17}$ may independently be hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heteroaryl group, a substituted or unsubstituted carbazolyl group, a halogen, a cyano group, or a combination thereof, and $m_1$ to $m_3$ may independently be 0 or 1.

In some example embodiments, the organic buffer layer may include a compound represented by one of Chemical Formulae C-4 to C-7.

[Chemical Formula C-4]

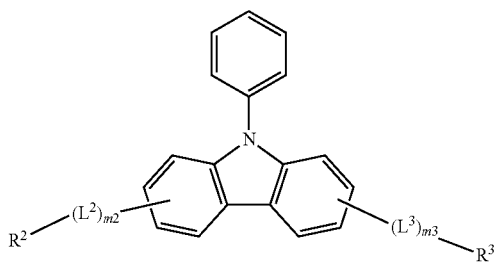

[Chemical Formula C-5]

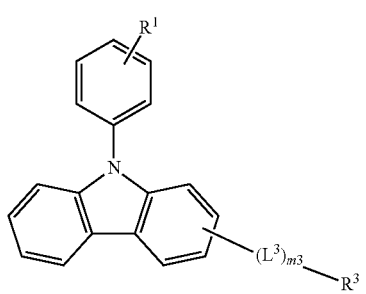

[Chemical Formula C-6]

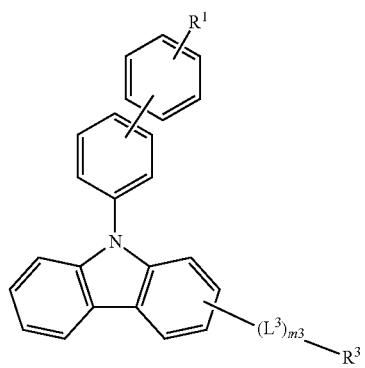

[Chemical Formula C-7]

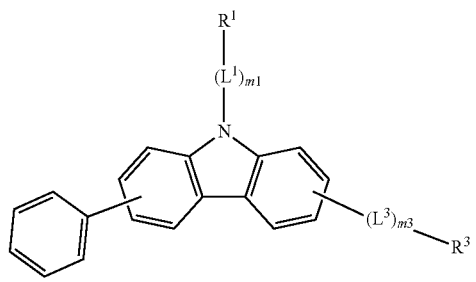

In Chemical Formulae C-4 to C-7, $L^1$ to $L^3$ may independently be a phenyl group, $m_1$ to $m_3$ may independently be 0 or 1, and $R^1$ to $R^3$ may independently be a carbazolyl group or a phenyl-substituted carbazolyl group.

In some example embodiments, the organic buffer layer may include a compound represented by Chemical Formula C-8 or C-9.

[Chemical Formula C-8]

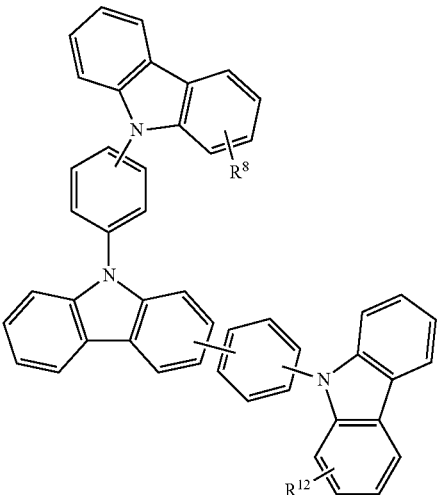

[Chemical Formula C-9]

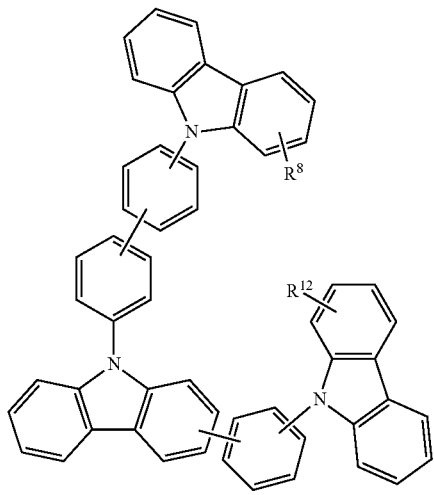

In Chemical Formula C-8 or C-9, $R^8$ and $R^{12}$ may independently be hydrogen or a phenyl group.

One of the buffer layers 134 and 135 may be an inorganic buffer layer. In some example embodiments, the inorganic buffer layer may include a lanthanide element, calcium (Ca), potassium (K), aluminum (Al), or an alloy thereof. The lanthanide element may include, in some example embodiments, ytterbium (Yb). The inorganic auxiliary layer may have a thickness of less than or equal to about 5 nm, and within the range, in some example embodiments, and may have a thickness of about 1 nm to about 5 nm, about 1 nm to about 4 nm, about 1 nm to about 3 nm, or about 1 nm to about 2 nm.

One of the buffer layers 134 or 135 may be an organic/inorganic buffer layer.

One or two of the buffer layers 134 or 135 may be omitted.

An anti-reflection layer (not shown) may be further included on the first photo-sensing device 100. The anti-reflection layer may be disposed at a light incidence side (e.g., distal from the semiconductor substrate 200 in relation to the first photo-sensing device 100) and lower reflectance of incident light and thereby light absorbance is further improved. The anti-reflection layer may include, for example a material having a refractive index of about 1.6 to about 2.5, and may include for example at least one of metal oxide, metal sulfide, or an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as a zinc sulfide; or an organic material such as an amine derivative, but is not limited thereto.

In the first photo-sensing device 100, when light enters through the upper electrode 132 and the photoelectric conversion layer 133 absorbs light having the wavelength spectrum of the first color (also referred to interchangeably as light of the wavelength spectrum of the first color), excitons may be generated therein. Excitons may be separated into holes and electrons in the photoelectric conversion layer 133. The separated holes may be transported to an anode which is one of the lower electrode 131 or the upper electrode 132, and the separated electrons may be transported to a cathode which is the other of the lower electrode 131 and the upper electrode 132 so as to flow a current. Separated electrons and/or holes may be collected in the charge storage 250.

The semiconductor substrate 200 may be, in some example embodiments, a silicon substrate, and the second photo-sensing device 210, the third photo-sensing device 220, the charge storage 250, and a transfer transistor (not shown) are integrated therein. As referred to herein, an element that is "integrated" in another element may be interchangeably referred to as being "embedded" in the other element and may be understood to be partially or completely located within a volume space defined by outermost surfaces of the other element, such that the element is partially or completely covered by the other element. For example, as shown in FIGS. 4A-4B, the first and second photo-sensing devices 210 and 220 are both located within the volume space defined by the outer surfaces (including the upper surface 200s) of the semiconductor substrate 200 and thus are integrated in the semiconductor substrate 200.

The second photo-sensing device 210 or the third photo-sensing device 220 may be disposed in each pixel PX of the image sensor 300, and the pixel PX including the second photo-sensing device 210 and the pixel (PX) including the third photo-sensing device 220 may be alternately repetitively aligned along a column and/or a row (e.g., an x direction and/or a y direction). In this way, as the second photo-sensing device 210 and the third photo-sensing device 220 are alternately arranged in a parallel direction (e.g., the x direction and/or the y direction) to the upper surface 200s of the semiconductor substrate 200, the second photo-sensing device 210 and the third photo-sensing device 220 are not overlapped with each other along a thickness direction of the semiconductor substrate 200. As shown in FIGS. 4A-4B, the second photo-sensing device 210 and the third photo-sensing device 220 may be spaced apart from each other in a surface direction extending parallel to the upper surface 200s of the semiconductor substrate 200 (e.g., an x direction and/or y direction). As referred to herein, a direction extending parallel to the upper surface 200s of the semiconductor substrate 200 (e.g., the x direction and/or the y direction) may be referred to as a surface direction, and a direction extending perpendicular to the upper surface 200s of the semiconductor substrate 200 (e.g., the z direction) may be referred to as a thickness direction.

The second photo-sensing device 210 and the third photo-sensing device 220 may be respectively overlapped with the first photo-sensing device 100 along (e.g., in) the thickness direction (e.g., a z direction) of the semiconductor substrate 200. In particular, as shown in FIGS. 1-4A, the first photo-sensing device 100 may extend over (e.g., overlap in the thickness direction) both the adjacent second and third photo-sensing devices 210 and 220 in at least a portion of the image sensor 300.

The second photo-sensing device 210 and the third photo-sensing device 220 may be respectively photodiodes (e.g., silicon-based photodiodes) each having a particular (or, alternatively, predetermined) thickness inside the semiconductor substrate 200. In some example embodiments, the second photo-sensing device 210 may have an upper surface 210p close to (e.g., proximate to) the upper surface 200s of the semiconductor substrate 200 (wherein the upper surface 200s of the semiconductor substrate 200 is close to, or proximate to, the second photo-sensing device 210); a lower surface 210q facing the upper surface 210p and distal from the upper surface 200s in relation to the upper surface 210p; and a doped region 210d between the upper surface 210p and the lower surface 210q, and the third photo-sensing device 220 may have an upper surface 220p close to (e.g., proximate to) the upper surface 200s of a semiconductor substrate 200; a lower surface 220q facing the upper surface 220p and distal from the upper surface 200s in relation to the upper surface 220p; and a doped region 220d between the upper surface 220p and the lower surface 220q. It will be understood that the upper surface 200s of the semiconductor substrate 200 may be referred to interchangeably herein as the surface of the semiconductor substrate 200.

The doped region 210d of the second photo-sensing device 210 and the doped region 220d of the third photo-sensing device 220 may be conductive regions, respectively. In some example embodiments, the doped region 210d of the second photo-sensing device 210 and the doped region 220d of the third photo-sensing device 220 may be doped with an n-type dopant or a p-type dopant with a high concentration. The n-type dopant may be, in some example embodiments, phosphorus (P), arsenic (As), antimony (Sb), and/or bismuth (Bi), and the p-type dopant may be, in some example embodiments, boron (B), aluminum (Al), and/or gallium (Ga), but is not limited thereto. The doping concentration of the n-type or p-type dopant may be, in some example embodiments, greater than or equal to about $1 \times 10^{14}/cm^2$, in some example embodiments, greater than or equal to about $5 \times 10^{14}/cm^2$, or greater than or equal to about $1 \times 10^{16}/cm^2$, but is not limited thereto.

The second photo-sensing device 210 and the third photo-sensing device 220 may each be configured to sense light in a different wavelength spectrum using a difference between penetration depths depending on a wavelength of light passed into the semiconductor substrate 200. Accordingly, high color separation characteristics may be obtained without color separation means such as a color filter.

In some example embodiments, the second photo-sensing device 210 may be configured to sense light passing the first photo-sensing device 100, that is, the light of (e.g., light in) a second wavelength spectrum, which may be a wavelength spectrum of a second color (e.g., a wavelength spectrum associated with a second color) out of the light except for the light of the wavelength spectrum of the first color in the visible light spectrum (e.g., the second wavelength spectrum may partially or completely exclude the first wavelength spectrum), and the third photo-sensing device 220 may be configured to sense light passing the first photo-sensing device 100, that is, light of (e.g., light in) a third wavelength spectrum, which may be a wavelength spectrum of a third color (e.g., a wavelength spectrum associated with a third color) out of the light except for the light of the wavelength spectrum of the first color in the visible light spectrum (e.g., the third wavelength spectrum may partially or completely exclude the first wavelength spectrum). Any descriptions herein to the wavelength spectrum of the second color may be applied interchangeably to the second wavelength spectrum. Any descriptions herein to the wavelength spectrum of the third color may be applied interchangeably to the third wavelength spectrum. The light of the wavelength spectrum of the second color and the light of the wavelength spectrum of the third color may be respectively light of one color out of three primary colors, and the first color, the second color, and the third color may be respectively light of each different wavelength spectrum. In some example embodiments, the light of the second color and the light of the third color may be respectively blue light, green light, or red light, in some example embodiments, blue light or red light. In some example embodiments, the light of the second color may be blue light, and the light of the third color may be red light.

As referred to herein, the first, second, and third wavelength spectra of light may be different wavelength spectra that may partially overlap or not overlap at all. One or more of the first, second, and third wavelength spectra may include, or be, a visible wavelength spectrum of light. For example, the first wavelength spectrum may be a first visible wavelength spectrum associated with green light, the second wavelength spectrum may be a second visible wavelength spectrum associated with blue light, and the third wavelength spectrum may be a third visible wavelength spectrum associated with red light. However, it will be understood that, in some example embodiments one or more (or all) of the first, second, and third wavelength spectra may include, or be, a non-visible wavelength spectrum of light. For example, in some example embodiments, the first wavelength spectrum of light may include, or be, an infrared wavelength spectrum of light, an ultraviolet wavelength spectrum of light, or some combination thereof with at least a portion of the visible wavelength spectrum, while the second and third wavelength spectra of light may include, or be, visible wavelength spectra (e.g., blue light, red light, and/or green light).

In some example embodiments, the third photo-sensing device 220 may be disposed deeper from (e.g., distal from) the surface 200s of the semiconductor substrate 200 than the second photo-sensing device 210, and accordingly, the third photo-sensing device 220 may be configured to sense light of a longer wavelength spectrum than the second photo-sensing device 210. In some example embodiments, the third wavelength spectrum (e.g., wavelength spectrum of the third color) sensed in the third photo-sensing device 220 may be a longer wavelength spectrum than the second wavelength spectrum (e.g., wavelength spectrum of the second color) sensed in the second photo-sensing device 210. In some example embodiments, the wavelength spectrum of the third color may be a red wavelength spectrum, and the wavelength spectrum of the second color may be a blue wavelength spectrum or a green wavelength spectrum. In some example embodiments, the wavelength spectrum of the third color may be a green wavelength spectrum, and the wavelength spectrum of the second color may be a blue wavelength spectrum. In some example embodiments, the wavelength spectrum of the first color may be a green wavelength spectrum, the wavelength spectrum of the second color may be a blue wavelength spectrum, and the wavelength spectrum of the third color may be a red wavelength spectrum.

In some example embodiments, the depth $D_3$ from the upper surface 200s of the semiconductor substrate 200 to the upper surface 220p of the third photo-sensing device 220 may be deeper than the depth $D_2$ from the upper surface 200s of the semiconductor substrate 200 to the upper surface 210p of the second photo-sensing device 210, by about 300 nm or more. Restated, the upper surface 220p of the third photo-sensing device 220 may be distal from the upper surface 200s of the semiconductor substrate 200 in relation to the upper surface 210p of the second photo-sensing device 210, for example by a distance that is equal to or greater than about 300 nm. In some example embodiments, the depth $D_2$ of the upper surface 210p of the second photo-sensing device 210 from the upper surface 200s of the semiconductor substrate 200 (e.g., the depth $D_2$ of upper surface 210p) may be about 0 nm to about 200 nm, and the depth $D_3$ of the upper surface 220p of the third photo-sensing device 220 may be about 300 nm to about 1 μm. In some example embodiments, the upper surface 210p of the second photo-sensing device 210 may be substantially the same as the upper surface 200s of the semiconductor substrate 200 (e.g., the depth $D_2$ may be substantially a null value such that the upper surface 210p may be at least partially coplanar with the upper surface 200s), but the depth $D_3$ of the upper surface 220p of the third photo-sensing device 220 may be about 400 nm to about 1 μm or about 400 nm to about 800 nm from the upper surface 200s of the semiconductor substrate 200.

In some example embodiments, the depth $D_3$ of the third photo-sensing device 220 may have an influence on wavelength selectivity of the third photo-sensing device 220, in some example embodiments, the depth $D_3$ of the third photo-sensing device 220 may be selected by considering wavelength selectivity of the third color with respect to the second color of the third photo-sensing device 220. Restated, a wavelength selectivity of the third wavelength spectrum relative to the second wavelength spectrum of the third photo-sensing device 220 may vary depending on a depth of the upper surface 220p of the third photo-sensing device 220 from the upper surface 200s of the semiconductor substrate 200 in the thickness direction. Herein, the wavelength selectivity may be for example verified by a ratio of external quantum efficiency (EQE) at a wavelength belonging to the wavelength spectrum of the third color relative to external quantum efficiency at a wavelength belonging to the wavelength spectrum of the second color.

In some example embodiments, the depth $D_3$ of the third photo-sensing device 220 may be selected to satisfy Relationship Equation 1.

$$EQE(\lambda_3) \geq 3 \times EQE(\lambda_2) \qquad \text{[Relationship Equation 1]}$$

In Relationship Equation 1,

EQE ($\lambda_3$) is external quantum efficiency at a wavelength ($\lambda_3$) belonging to a wavelength spectrum of the third color of the third photo-sensing device when a depth of the upper surface of the third photo-sensing device (e.g., distance of said upper surface of the third photo-sensing device from the upper surface of the semiconductor substrate in the thickness direction) is $D_3$, and EQE ($\lambda_2$) is external quantum efficiency at a wavelength ($\lambda_2$) belonging to a wavelength spectrum of the second color of the third photo-sensing device when a depth of the upper surface of the third photo-sensing device is $D_3$.

The depth $D_3$ of the third photo-sensing device 220 satisfies Relationship Equation 1 and thus increases sensitivity of the wavelength spectrum of the third color in the third photo-sensing device 220 but suppresses sensitivity of the wavelength spectrum of the second color and accordingly, may improve color separation characteristics of the wavelength spectrum of the third color without mixing the wavelength spectra sensed in the third photo-sensing device 220. Accordingly, a crosstalk of the image sensor may be reduced or prevented.

In some example embodiments, the depth $D_3$ of the third photo-sensing device 220 may be selected to satisfy Relationship Equation 1A.

$$EQE(\lambda_3) \geq 5 \times EQE(\lambda_2) \qquad \text{[Relationship Equation 1A]}$$

In some example embodiments, the depth $D_3$ of the third photo-sensing device 220 may be selected to satisfy Relationship Equation 1B.

$$EQE(\lambda_3) \geq 7 \times EQE(\lambda_2) \qquad \text{[Relationship Equation 1B]}$$

In some example embodiments, the depth $D_3$ of the third photo-sensing device 220 may be selected to satisfy Relationship Equation 1C.

$$EQE(\lambda_3) \geq 10 \times EQE(\lambda_2) \qquad \text{[Relationship Equation 1C]}$$

In some example embodiments, the third photo-sensing device 220 may be thicker (e.g., in the thickness direction) than the second photo-sensing device 210. In some example embodiments, a thickness $T_3$ of the doped region 220d of the third photo-sensing device 220 may be greater than or equal to about 1.5 times, in some example embodiments, within the range, about 1.5 times to about 5 times, about 1.5 times to about 4 times, or about 1.5 times to about 3 times thicker than a thickness $T_2$ of the doped region 210d of the second photo-sensing device 210.

The thicknesses $T_2$ and $T_3$ of the doped regions 210d and 220d of the second photo-sensing device 210 and the third photo-sensing device 220 may respectively have an influence on electrical characteristics of the image sensor 300 in the wavelength spectrum of the second color and the wavelength spectrum of the third color and thus may be formed to balance the electrical characteristics in the wavelength spectrum of the second color and the wavelength spectrum of the third color. For example, an external quantum efficiency, at a wavelength included in the third wavelength spectrum, of the third photo-sensing device 220 may be different based on a thickness, in the thickness direction, of the doped region 220d of the third photo-sensing device 220. Herein, the electrical characteristics may be for example external quantum efficiency (EQE).

In some example embodiments, the thickness of the doped region 220d of the third photo-sensing device 220 may be selected to satisfy Relationship Equation 2.

$$2.5 \times EQE(T_3) \geq EQE(T_2) \qquad \text{[Relationship Equation 2]}$$

In Relationship Equation 2,

EQE ($T_3$) is external quantum efficiency at a wavelength belonging to (e.g., included in) the wavelength spectrum of the third color when a thickness of the doped region of the third light sensing element (e.g., the third photo-sensing device 220) is $T_3$, EQE ($T_2$) is external quantum efficiency at a wavelength belonging to the wavelength spectrum of the second color when a thickness of the doped region of the second light sensing element (e.g., the second photo-sensing device 210) is $T_2$, and
$T_3 > T_2$.

In some example embodiments, the thickness of the doped region of the third photo-sensing device 220 may be selected to satisfy Relationship Equation 2A.

$$2 \times EQE(T_3) \geq EQE(T_2) \quad \text{[Relationship Equation 2A]}$$

In some example embodiments, the thickness of the doped region of the third photo-sensing device 220 may be selected to satisfy Relationship Equation 2B.

$$1.5 \times EQE(T_3) \geq EQE(T_2) \quad \text{[Relationship Equation 2B]}$$

In some example embodiments, the thickness $T_3$ of the doped region 220d of the third photo-sensing device 220 may be greater than or equal to about 1 μm and within the range, about 1 μm to about 3 μm, about 1 μm to about 2.5 μm, about 1 μm to about 2 μm, about 1.2 μm to about 3 μm, about 1.2 μm to about 2.5 μm, about 1.2 μm to about 2 μm.

In some example embodiments, the thickness $T_2$ of the doped region 210d of the second photo-sensing device 210 may be less than or equal to about 800 nm and within the range, about 200 nm to about 800 nm, about 300 nm to about 700 nm, or about 400 nm to about 600 nm.

When the thickness is within the range, the electrical characteristics in the wavelength spectrum of the second color sensed in the second photo-sensing device 210 and the wavelength spectrum of the third color sensed in the third photo-sensing device 220 may be effectively balanced, and thus performance of the image sensor may be improved.

The second photo-sensing device 210 and the third photo-sensing device 220 may, respectively, be configured to sense (e.g., absorb and/or photoelectrically convert) light of the wavelength spectrum of the second color and light of the wavelength spectrum of the third color, and the sensed information may be transferred by a transmission transistor. The charge storage 250 is electrically connected to the first photo-sensing device 100, and information of the charge storage 250 may be transferred by the transmission transistor.

A metal line (not shown) and a pad (not shown) are formed under or on the second photo-sensing device 210, the third photo-sensing device 220, and the charge storage 250. The metal line and the pad may be made of a metal having low resistivity, in some example embodiments, aluminum (Al), copper (Cu), silver (Ag), and an alloy thereof in order to reduce a signal delay but is not limited thereto.

Between the first photo-sensing device 100 and the semiconductor substrate 200, insulation layers 60 and 80 are formed. In some example embodiments, the insulation layer 60 may be in contact with the semiconductor substrate 200, and the insulation layer 80 may be in contact with the first photo-sensing device 100. In some example embodiments, the lower electrode 131 of the first photo-sensing device 100 may be internally embedded in (e.g., integrated in) the insulation layer 80. When the insulation layer 80 is omitted, the lower electrode 131 of the first photo-sensing device 100 may be internally embedded in (e.g., integrated in) the insulation layer 60. In some example embodiments, the upper surface 210p of the second photo-sensing device 210 may be in contact with the insulation layer 60.

The insulation layers 60 and 80 may each independently be made of (e.g., may each at least partially comprise) an inorganic insulating material such as silicon oxide and/or silicon nitride or a low dielectric constant (low k) material such as SiC, SiCOH, SiCO, and SiOF. The insulation layers 60 and 80 may have a trench 85 exposing the charge storage 250. The trench 85 may be filled with a filler. Any one of the insulation layers 60 or 80 may be omitted. For example, insulation layer 80 may be omitted, and insulation layer 60 may be in contact with both the semiconductor substrate 200 and the first photo-sensing device 100.

The image sensor 300 may further include a focusing lens 190. The focusing lens 190 may be disposed on the first photo-sensing device 100 and may control a direction of incident light to collect light into a single point. In some example embodiments, the focusing lens 190 may not be disposed between the first photo-sensing device 100 and the semiconductor substrate 200. The focusing lens 190 may be, in some example embodiments, a cylinder shape or a hemisphere shape, but is not limited thereto. The focusing lens 190 may be arranged for each pixel PX or may be arranged over a plurality of pixels PX.

As shown in FIGS. 1-4B, each pixel PX may be defined as a separate portion of the image sensor 300 that includes a photo-sensing device 210 and/or 220 integrated in the semiconductor substrate 200 and may further include some or all of a portion of the image sensor 300 that overlaps the photo-sensing device 210 and/or 220 (e.g., a portion of the first photo-sensing device 100) in the thickness direction (e.g., some or all portions of the image sensor 300 that overlap an individual photo-sensing device 210 may be considered to be included in a singular pixel PX that is at least partially defined by the individual photo-sensing device 210). In some example embodiments, a pixel PX is considered to be a portion of the image sensor 300 that includes at least one second photo-sensing device 210, at least one third photo-sensing device 220, and some or all portions of the image sensor 300 that overlaps with the at least one second photo-sensing device 210 and the at least one third photo-sensing device 220 in the thickness direction. For example, the portions of the image sensor 300 shown in FIGS. 4A-4B, instead of being two separate pixels as shown, may each be a single pixel that includes, in FIG. 4A, photo-sensing devices 100, 210, and 220 and include, in FIG. 4B, photo-sensing devices 100A, 100B, 210, and 220.

The image sensor 300 some example embodiments includes the second photo-sensing device 210 and third photo-sensing device 220 by using a penetration depth difference depending on a wavelength of light as described above but does not include a separate color separation means such as a color filter.

Accordingly, a process of forming the color separation means such as the color filter may be omitted and thus may simplify a manufacturing process and also reduce a manufacture cost. In addition, contamination due to an organic material coming out of the color filter during the process and/or the drive may be prevented, and accordingly, performance degradation of the image sensor may be prevented.

Furthermore, a transmittance loss due to the color separation means such as the color filter may be prevented, and accordingly, sensitivity of the image sensor may be improved. Particularly, sensitivity of the wavelength spectrum of the second color (e.g., blue light) may be greatly improved, in some example embodiments, external quantum efficiency at a wavelength belonging to the wavelength spectrum (e.g., a blue wavelength spectrum) of the second color in the image sensor 300 according to the aforementioned structure may be about 5% or more, about 7% or more, or about 10% or more higher compared with external quantum efficiency at a wavelength belonging to the wavelength spectrum (e.g., blue wavelength spectrum) of the second color in an image sensor of a structure adopting the color filter.

As sensitivity of the wavelength spectrum of the second color is higher, external quantum efficiency at a wavelength belonging to the wavelength spectrum of the second color of the second photo-sensing device 210 may be higher, in some example embodiments, greater than or equal to about 1.1 times, greater than or equal to about 1.2 times, greater than or equal to about 1.5 times, greater than or equal to about 1.8 times, or greater than or equal to about 2 times higher than external quantum efficiency at a wavelength belonging to the wavelength spectrum of the third color of the third photo-sensing device 220. Within the range, external quantum efficiency at a wavelength belonging to the wavelength spectrum of the second color of the second photo-sensing device 210 may be about 1.1 times to about 3 times, about 1.2 times to about 3 times, about 1.5 times to about 3 times, about 1.8 times to about 3 times, about 2 times to about 3 times, about 1.1 times to about 2.5 times, about 1.2 times to about 2.5 times, about 1.5 times to about 2.5 times, about 1.8 times to about 2.5 times, or about 2 times to about 2.5 times higher than external quantum efficiency at a wavelength belonging to the wavelength spectrum of the third color of the third photo-sensing device 220.

In some example embodiments, as the external quantum efficiency of the wavelength spectrum (e.g., blue wavelength spectrum) of the second color is improved, the external quantum efficiency of the other spectra except for the wavelength spectrum of the second color, in some example embodiments, the wavelength spectrum (e.g., red wavelength spectrum) of the third color also needs to be balanced with the external quantum efficiency of the wavelength spectrum of the second color, and accordingly, a difference between the external quantum efficiency of the wavelength spectrum of the second color and the external quantum efficiency of the wavelength spectrum of the third color of the third photo-sensing device 220 may be adjusted to be less than or equal to about 50%. Accordingly, the external quantum efficiency difference of the wavelength spectrum of the second color and the wavelength spectrum of the third color of the third photo-sensing device 220 may be about 10% to about 50%, about 12% to about 50%, about 15% to about 50%, about 18% to about 50%, or about 20% to about 50%. A balance between such external quantum efficiencies may be adjusted by the depth $D_3$ and the thickness $T_3$ of the third photo-sensing device 220.

In some example embodiments, differences among external quantum efficiency at a wavelength belonging to the wavelength spectrum of the first color, external quantum efficiency at a wavelength spectrum belonging to the wavelength spectrum of the second color, and external quantum efficiency at a wavelength spectrum belonging to the wavelength spectrum of the third color of the image sensor 300 may be respectively less than or equal to about 50%, about 10% to about 50%, about 12% to about 50%, about 15% to about 50%, about 18% to about 50%, or about 20% to about 50%.

As for the image sensor 300 according to some example embodiments, the second photo-sensing device 210 and the third photo-sensing device 220 disposed in the semiconductor substrate 200 are not overlapped with each other in the thickness direction (e.g., a z direction) of the semiconductor substrate 200 and accordingly, may prevented from mixing the wavelength spectra of the second and third colors and thus reduce or prevent a crosstalk thereof.

As shown in FIGS. 1-4B, the image sensor 300 may not include any color filter. However, example embodiments are not limited thereto, and in some example embodiments the image sensor 300 may include a color filter overlapping at least one of the photo-sensing devices 100, 100A, 100B, 210, 220 in the thickness direction (e.g., z direction).

As shown in FIGS. 4A-4B, in some example embodiments, the second and third photo-sensing devices 210 and 220 may be at least partially overlapped with each other in the surface direction (e.g., x direction and/or y direction), such that the lower surface 210q of the second photo-sensing device 210 is equidistant or distal from the upper surface 200s of the semiconductor substrate 200 in relation to the upper surface 220p of the third photo-sensing device 220 (e.g., D2+T2≥D3).

As shown in FIGS. 4A-4B, the upper surface 220p of the third photo-sensing device 220 is distal from the upper surface 200s of the semiconductor substrate 200 in relation to the upper surface 210p of the second photo-sensing device 210 (e.g., the upper surface 220p of the third photo-sensing device 220 is deeper from the upper surface 200s in the semiconductor substrate 200 than the upper surface 210p of the second photo-sensing device 210), and the doped region 220d of the third photo-sensing device 220 is thicker, in the thickness direction (e.g., z direction), than the doped region 210d of the second photo-sensing device 210 (e.g., T3>T2). However, example embodiments are not limited thereto, and in some example embodiments, the third photo-sensing device 220 may have at least one of the upper surface 220p of the third photo-sensing device 220 being distal from the upper surface 200s of the semiconductor substrate 200 in relation to the upper surface 210p of the second photo-sensing device 210, or the doped region 220d of the third photo-sensing device 220 being thicker, in the thickness direction, than the doped region 210d of the second photo-sensing device 210. For example, in some example embodiments, T3>T2 but D2=D3. In another example, in some example embodiments, D3>D2 but T2=T3.

In some example embodiments, the second and third photo-sensing devices 210 and 220 are not overlapped with each other in the surface direction (e.g., x direction and/or y direction), such that the lower surface 210q of the second photo-sensing device 210 is proximate to the upper surface 200s of the semiconductor substrate 200 in relation to the upper surface 220p of the third photo-sensing device 220 (e.g., D2+T2<D3).

Referring to FIG. 4B in particular, which may be a cross-sectional view of the image sensor 300 shown in FIGS. 1-3 according to some example embodiments, the first photo-sensing device 100 may include multiple, separate photo-sensing devices 100A and 100B that may overlap separate ones of the second photo-sensing device 210 or the third photo-sensing device 220 in the thickness direction (e.g., z direction), where the separate photo-sensing devices 100A and 100B overlap in the surface direction (e.g., x direction and/or y direction) and may include separate layers and/or may include separate portions of one or more layers that extend continuously between the separate photo-sensing devices 100A and 100B (e.g., are single pieces of material having separate portions located in separate photo-sensing devices 100A and/or 100B).

As shown in FIG. 4B, photo-sensing device 100A may include a lower electrode 131A and an upper electrode 132A facing each other, a photoelectric conversion layer 133A between the lower electrode 131A and the upper electrode 132A, and optionally buffer layers 134A and 135A, while photo-sensing device 100B may include a lower electrode 131B and an upper electrode 132B facing each other, a photoelectric conversion layer 133B between the lower electrode 131B and the upper electrode 132B, and optionally buffer layers 134B and 135B.

In the example embodiments shown in FIG. 4B, the photoelectric conversion layers 133A and 133B are separate layers (e.g., not a single piece of material) which may be in direct contact or spaced apart from each other in the surface direction and which may have different materials (e.g., different material compositions) and thus may be configured to absorb and photoelectrically convert (e.g., sense) different wavelength spectra of light, which may be any of the wavelength spectra of light described herein and/or any combination thereof. However, example embodiments are not limited thereto, and in some example embodiments the photoelectric conversion layers 133A and 133B are separate portions of a single-piece, continuous photoelectric conversion layer 133 that extends between the photo-sensing devices 100A and 100B.

In the example embodiments shown in FIG. 4B, the upper electrodes 132A and 132B are separate portions of a single-piece, continuous upper electrode 132 that extends between the photo-sensing devices 100A and 100B. However, example embodiments are not limited thereto, and in some example embodiments, upper electrodes 132A and 132B are separate layers (e.g., not a single piece of material) which may be in direct contact or spaced apart from each other in the surface direction and which may have different materials (e.g., different material compositions).

In the example embodiments shown in FIG. 4B, the lower electrodes 131A and 131B are separate layers (e.g., not a single piece of material) which may be in direct contact or spaced apart from each other in the surface direction and which may have different materials (e.g., different material compositions). However, example embodiments are not limited thereto, and in some example embodiments, lower electrodes 131A and 131B are separate portions of a single-piece, continuous lower electrode 131 that extends between the photo-sensing devices 100A and 100B.

In the example embodiments shown in FIG. 4B, the buffer layers 134A and 134B are separate portions of a single-piece, continuous buffer layer 134 that extends between the photo-sensing devices 100A and 100B. However, example embodiments are not limited thereto, and in some example embodiments, buffer layers 134A and 134B are separate layers (e.g., not a single piece of material) which may be in direct contact or spaced apart from each other in the surface direction and which may have different materials (e.g., different material compositions).

In the example embodiments shown in FIG. 4B, the buffer layers 135A and 135B are separate portions of a single-piece, continuous buffer layer 135 that extends between the photo-sensing devices 100A and 100B. However, example embodiments are not limited thereto, and in some example embodiments, buffer layers 135A and 135B are separate layers (e.g., not a single piece of material) which may be in direct contact or spaced apart from each other in the surface direction and which may have different materials (e.g., different material compositions).

Still referring to FIG. 4B, the photo-sensing devices 100A and 100B may each be configured to sense light of a different wavelength spectrum. For example, in example embodiments where the photo-sensing device 100A is configured to sense light of a first wavelength spectrum, photo-sensing device 210 is configured to sense light of a second wavelength spectrum, photo-sensing device 220 is configured to sense light of a third wavelength spectrum, and the photo-sensing device 100B is configured light of a fourth wavelength spectrum, the first to fourth wavelength spectra may be different from each other (and may or may not at least partially overlap with one or more of each other). One or more of the first to fourth wavelength spectra may be a visible wavelength spectrum (e.g., associated with red light, blue light, and/or green light) a non-visible wavelength spectrum (e.g., associated with infrared light and/or ultra-violet light), or any combination thereof.

As shown in FIG. 4B, the photo-sensing devices 100A and 100B may each overlap, in the thickness direction (e.g., z direction) with a separate one of the photo-sensing devices 210 or 220. Thus, in some example embodiments, one or more photo-sensing devices 210 of the image sensor 300 may overlap in the thickness direction with one of the photo-sensing devices 100A or 100B (e.g., photo-sensing device 100A as shown in FIG. 4B), and the photo-sensing devices 220 of the image sensor 300 may overlap in the thickness direction with the other one of the photo-sensing devices 100A or 100B (e.g., photo-sensing device 100B as shown in FIG. 4B).

In some example embodiments, the photo-sensing devices 100A and 100B may each overlap, in the thickness direction (e.g., z direction) with a separate set of photo-sensing devices 210 and 220 of the image sensor 300 (e.g., separate sets of pixels PX of the image sensor 300). For example, photo-sensing device 100A may overlap in the thickness direction with photo-sensing devices 210 and 220 of a first set of pixels PX of the image sensor 300, and photo-sensing device 100B may overlap in the thickness direction with photo-sensing devices 210 and 220 of a different, second set of pixels PX of the image sensor 300.

While FIGS. 1-4B illustrate example embodiments of an image sensor 300 that includes the first photo-sensing device 100 and/or photo-sensing devices 100A, 100B on the semiconductor substrate 200 and overlapping in the thickness direction with second and third photo-sensing devices 210, 220, it will be understood that, in some example embodiments, the image sensor 300 may not include any first photo-sensing device 100 and/or any photo-sensing devices 100A, 1008 overlapping some or all of the second and third photo-sensing devices 210, 220. For example, in some example embodiments, the image sensor 300 may not include any photo-sensing device 100, 100A, 1008 overlapping any of the photo-sensing devices 210, 220 of the image sensor 300. In another example, in some example embodiments, the image sensor 300 may include one or more photo-sensing devices 100, 100A, and/or 100B that overlap a first set of the second and third photo-sensing devices 210, 220 of a first set of the pixels PX but the image sensor 300 further does not include any photo-sensing device 100, 100A, 100B overlapping another, separate set of the photo-sensing devices 210, 220 of the image sensor 300. In another example, in some example embodiments, the image sensor 300 may include one or more photo-sensing devices 100, 100A, and/or 100B that overlap one of the second and third photo-sensing devices 210, 220 of one or more, or all of the pixels PX but the image sensor 300 further does not include any photo-sensing device 100, 100A, 1008 overlapping the other of the second and third photo-sensing devices 210, 220 of one or more, or all of the pixels PX (e.g., the image sensor 300 includes a first photo-sensing device 100 overlapping the second photo-sensing devices 210 of some or all of the pixels PX but does not include any photo-sensing device overlapping the third photo-sensing devices 220 of some or all of the pixels PX).

The aforementioned image sensors may be applied to various electronic devices including video equipment, and may be applied to, in some example embodiments, mobile phones, cameras, camcorders, biometric devices, and/or automotive electronic components, but is not limited thereto.

Figure 5:
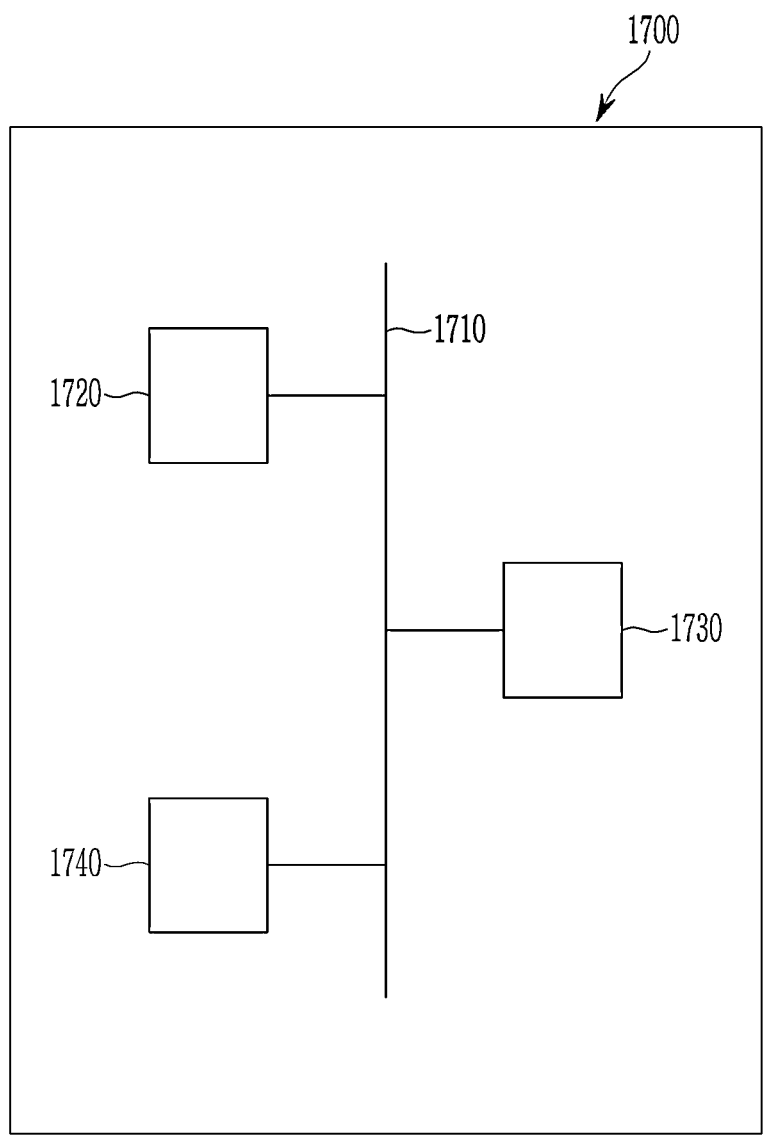
FIG. 5 is a schematic view showing an electronic device according to some example embodiments.

FIG. 5 is a schematic view of an electronic device according to some example embodiments.

Referring to FIG. 5, an electronic device 1700 may include a processor 1720, a memory 1730, and an image sensor 1740 that are electrically coupled together via a bus 1710. The image sensor 1740 may be any of the image sensors according to any of the example embodiments. The memory 1730, which may be a non-transitory computer readable medium, may store a program of instructions. The processor 1720 may execute the stored program of instructions to perform one or more functions. In some example embodiments, the processor 1720 may be configured to process electrical signals generated by the image sensor 1740. The processor 1720 may be configured to generate an output (e.g., an image to be displayed on a display interface) based on such processing.

The electronic device 1700, and/or any portions thereof (including, without limitation, the processor 1720, the memory 1730, and the image sensor 1740) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., memory 1730), for example a solid state drive (SSD), storing a program of instructions, and a processor (e.g., processor 1720) configured to execute the program of instructions to implement the functionality and/or methods performed by some or all of the electronic device 1700.

Hereinafter, some example embodiments are illustrated in more detail with reference to the following examples. However, the scope of the inventive concepts is not limited to the following examples.

Manufacture of First Photo-Sensing Device

Example 1

An ITO (WF: 4.9 eV) is sputtered on a glass substrate to form a 150 nm-thick anode. Subsequently, a compound represented by Chemical Formula A is deposited on the anode to form a 5 nm-thick lower buffer layer. Then, a p-type semiconductor ($\lambda_{max}$=555 nm) represented by Chemical Formula B and an n-type semiconductor fullerene (C60) in a volume ratio (thickness ratio) of 1:1 are co-deposited on the lower buffer layer to form a 100 nm-thick photoelectric conversion layer. Then, Yb is thermally deposited on the photoelectric conversion layer to form a 1.5 nm-thick upper buffer layer. Then, ITO is sputtered on the upper buffer layer to form a 7 nm-thick cathode. Then, aluminum oxide $Al_2O_3$ is deposited on the cathode to form a 50 nm-thick anti-reflection layer and then, sealed with a glass plate to manufacture a first photo-sensing device configured to selectively absorb green light and photoelectrically converts the absorbed light.

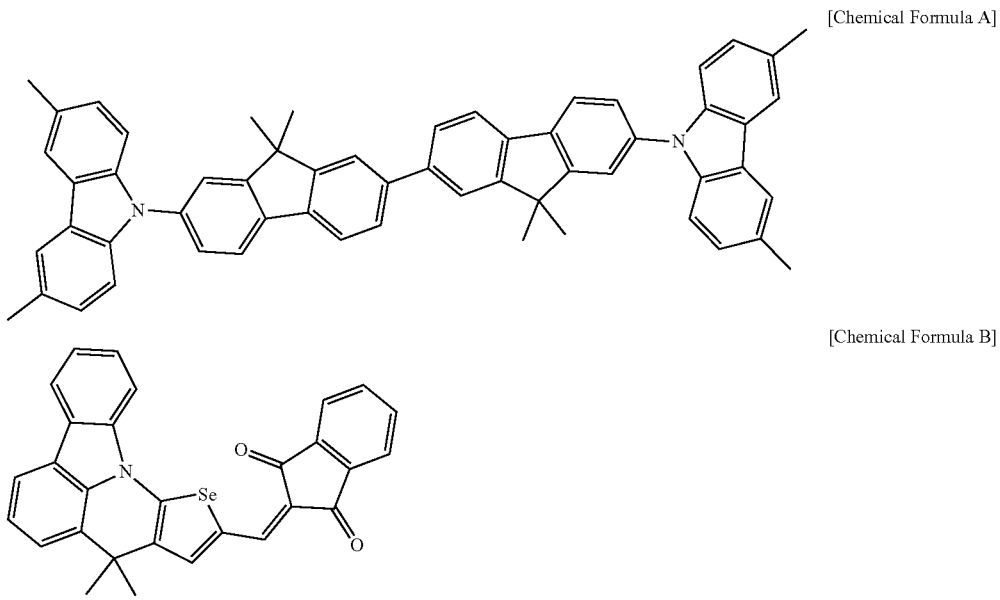

[Chemical Formula A]

[Chemical Formula B]

Design of Image Sensor I

The image sensor adopting the first photo-sensing device according to Example 1 is designed to have the structures of FIGS. 1 to 4A, and changes of external quantum efficiency of the image sensor depending on a thickness $T_3$ of a third photo-sensing device are evaluated.

Light absorption is calculated by using a refractive index (n), an extinction coefficient (k), and layer geometry of each layer according to Fresnel's equation, and external quantum efficiency (EQE) is calculated by using the light absorption and internal quantum efficiency of an organic photoelectric device and a Si photodiode and the obtained light absorption.

The results are shown in Table 1.

TABLE 1

| First photo-sensing device (green photoelectric conversion device) | Second photo-sensing device (blue photodiode) | Third photo-sensing device (red photodiode) | Efficiency of image sensor (EQE, %) | | |
|---|---|---|---|---|---|
| | | | Blue photodiode (@ 450 nm) | Green photoelectric conversion device (@ 550 nm) | Red photodiode (@ 650 nm) |
| Example 1 | $D_2 = 0$ nm / $T_2 = 500$ nm | $D_3 = 500$ nm / $T_3 = 1$ μm | 56.3 | 65.9 | 25.6 |
| | | $D_3 = 500$ nm / $T_3 = 1.5$ μm | | | 35.7 |
| | | $D_3 = 500$ nm / $T_3 = 2$ μm | | | 44.2 |

\* Depth ($D_2$ and $D_3$): Depth from the upper surface of the semiconductor substrate Referring to Table 1, it is confirmed that the external quantum efficiency is changed depending on a thickness of the third photo-sensing device (red photodiode), and specifically, as the third photo-sensing device (red photodiode) is thicker, the external quantum efficiency is higher in a red wavelength spectrum.

Design of Image Sensor II

The image sensor adopting the first photo-sensing device according to Example 1 is designed to have the structures of FIGS. 1 to 4A, and external quantum efficiency in each wavelength range of the third photo-sensing device depending on a thickness $D_3$ of the third photo-sensing device is evaluated.

The results are shown in Table 2.

Referring to Table 2, it is confirmed that wavelength selectivity of the image sensor may be changed depending on a depth of the third photo-sensing device (red photodiode) from a semiconductor substrate, and specifically, wavelength selectivity of a red wavelength spectrum with respect to a blue wavelength spectrum is improved, as a depth of the third photo-sensing device (red photodiode) goes deeper from the upper surface of the semiconductor substrate.

Design of Image Sensor III

The image sensor (Example 2) adopting the aforementioned first photo-sensing device is designed to have the structures of FIGS. 1 to 4A and an image sensor (Comparative Example) manufactured by equally changing depth and

TABLE 2

| First photo-sensing device (green photoelectric conversion device) | Second photo-sensing device (blue photodiode) | Third photo-sensing device (red photodiode) | Efficiency in each wavelength range of the third photo-sensing device (EQE, %) | | |
|---|---|---|---|---|---|
| | | | Blue wavelength spectrum (@ 450 nm) | Green wavelength spectrum (@ 550 nm) | Red wavelength spectrum (@ 650 nm) |
| Example 1 | $D_2 = 0$ nm / $T_2 = 500$ nm | $D_3 = 400$ nm / $T_3 = 2$ μm | 12.9 | 13.2 | 45.7 |
| | | $D_3 = 500$ nm / $T_3 = 2$ μm | 8.6 | 12.0 | 44.2 |
| | | $D_3 = 600$ nm / $T_3 = 2$ μm | 5.7 | 11.0 | 42.9 |
| | | $D_3 = 800$ nm / $T_3 = 2$ μm | 2.6 | 9.1 | 40.2 |
| | | $D_3 = 1000$ nm / $T_3 = 2$ μm | 1.1 | 7.6 | 37.8 |

\* Depth ($D_2$ and $D_3$): Depth from the upper surface of the semiconductor substrate thickness of the second and third photo-sensing devices in the image sensor of Example 2 and further having a blue filter/a red filter are evaluated with respect to efficiency in each wavelength spectrum.

The results are shown in Table 3.

TABLE 3

| | Efficiency (EQE, %) | | |
|---|---|---|---|
| | Blue PD (@ 450 nm) | Green photoelectric conversion device (@ 550 nm) | Red PD (@ 650 nm) |
| Example 2 | 56.3 | 65.9 | 41.4 |
| Comparative Example | 47.2 | 65.9 | 40.2 |

* $D_2$ = 0 nm, $T_2$ = 500 nm, $D_3$ = 500 nm, and $T_3$ = 2 μm

Referring to Table 3, the image sensor using no color filter according to Example 2 exhibits improved blue light sensitivity, compared with the image sensor using a color filter according to Comparative Example.

Design of Image Sensor IV

The image sensor adopting the first photo-sensing device is designed to have the structures of FIGS. 1 to 4A (Example 2) and the image sensor (Comparative Example) manufactured by equally changing depth and thickness of the second and third photo-sensing devices in the image sensor of Example 2 and further having a blue filter/a red filter are evaluated with respect to a leakage current.

The leakage current is evaluated by applying 3 V bias, while the image sensors are maintained at 60° C. and then, converting a saturated dark current into electron/um²/s.

The results are shown in Table 4.

TABLE 4

| | Dark current (electron/um²/s) |
|---|---|
| Example 2 | −1 |
| Comparative Example | 20 |

Referring to Table 4, the image sensor using no color filter according to Example 2 exhibits a greatly low dark current and thus secures reliability compared with the image sensor using a color filter according to the Comparative Example.

While the inventive concepts have been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

What is claimed is:

1. An image sensor, comprising:
a first photo-sensing device on a semiconductor substrate, the first photo-sensing device being configured to sense light in a first wavelength spectrum associated with a first color,
a second photo-sensing device integrated in the semiconductor substrate, the second photo-sensing device being configured to sense light of in a second wavelength spectrum associated with a second color, and
a third photo-sensing device integrated in the semiconductor substrate, the third photo-sensing device being configured to sense light in a third wavelength spectrum associated with a third color,
wherein the first photo-sensing device and the second photo-sensing device are overlapped with each other in a thickness direction of the semiconductor substrate, the thickness direction being perpendicular to an upper surface of the semiconductor substrate,
wherein the first photo-sensing device and the third photo-sensing device are overlapped with each other in the thickness direction,
wherein the second photo-sensing device and the third photo-sensing device are not overlapped with each other in the thickness direction,
wherein the second photo-sensing device and the third photo-sensing device each include
an upper surface that is proximate to the upper surface of the semiconductor substrate,
a lower surface facing the upper surface and distal from the upper surface of the semiconductor substrate, and
a doped region between the upper surface and the lower surface,
wherein the upper surface of the third photo-sensing device is distal from the upper surface of the semiconductor substrate in relation to the upper surface of the second photo-sensing device, and
wherein the doped region of the third photo-sensing device is thicker, in the thickness direction, than the doped region of the second photo-sensing device,
wherein an external quantum efficiency at a wavelength included in the third wavelength spectrum of the third photo-sensing device is different based on a thickness, in the thickness direction, of the doped region of the third photo-sensing device, and
wherein the thickness of the doped region of the third photo-sensing device satisfies Relationship Equation 1:

$$2.5 \times EQE(T_3) \geq EQE(T_2) \quad \text{[Relationship Equation 1]}$$

wherein, in Relationship Equation 1,
EQE ($T_3$) is external quantum efficiency at a wavelength included in the third wavelength spectrum based on the thickness of the doped region of the third photo-sensing device in the thickness direction being a thickness $T_3$,
EQE ($T_2$) is external quantum efficiency at a wavelength included in the second wavelength spectrum based on the thickness of the doped region of the second photo-sensing device in the thickness direction being a thickness $T_2$, and
$T_3 > T_2$.

2. The image sensor of claim 1, wherein the image sensor does not include any color filter.

3. The image sensor of claim 1, further comprising:
an insulation layer between the semiconductor substrate and the first photo-sensing device.

4. The image sensor of claim 1, wherein the upper surface of the third photo-sensing device is distal from the upper surface of the semiconductor substrate in relation to the upper surface of the second photo-sensing device by a distance that is equal to or greater than about 300 nm.

5. The image sensor of claim 4, wherein the upper surface of the second photo-sensing device is at a depth of about 0 nm to about 200 nm from the upper surface of the semiconductor substrate in the thickness direction.

6. The image sensor of claim 1, wherein
a wavelength selectivity of the third wavelength spectrum relative to the second wavelength spectrum of the third photo-sensing device varies depending on a depth of the upper surface of the third photo-sensing device from the upper surface of the semiconductor substrate in the thickness direction, and the depth of the upper surface of the third photo-sensing device from the upper surface of the semiconductor substrate in the thickness direction is a depth $D_3$ that satisfies Relationship Equation 2:

$$EQE(\lambda_3) \geq 3 \times EQE(\lambda_2) \quad \text{[Relationship Equation 2]}$$

wherein, in Relationship Equation 2,

EQE ($\lambda_3$) is external quantum efficiency at a wavelength ($\lambda_3$) included in the third wavelength spectrum of the third photo-sensing device based on the depth of the upper surface of the third photo-sensing device in the semiconductor substrate being the depth $D_3$, and EQE ($\lambda_2$) is external quantum efficiency at a wavelength ($\lambda_2$) included in the second wavelength spectrum of the third photo-sensing device based on the depth of the upper surface of the third photo-sensing device in the semiconductor substrate being the depth $D_3$.

7. The image sensor of claim 6, wherein the depth of the upper surface of the third photo-sensing device from the upper surface of the semiconductor substrate in the thickness direction is about 400 nm to about 1 µm.

8. The image sensor of claim 1, wherein the doped region of the third photo-sensing device is about 1.5 times to about 5 times thicker, in the thickness direction, than the doped region of the second photo-sensing device.

9. The image sensor of claim 1, wherein the thickness $T_3$ is greater than or equal to about 1 µm.

10. The image sensor of claim 1, wherein the thickness $T_2$ is about 200 nm to about 800 nm.

11. The image sensor of claim 1, wherein
the thickness $T_3$ is about 1 µm to about 3 µm, and
the thickness $T_2$ is about 300 nm to about 700 nm.

12. The image sensor of claim 1, wherein an external quantum efficiency at a wavelength included in the second wavelength spectrum of the second photo-sensing device is about 1.1 times to about 2.5 times higher than an external quantum efficiency at a wavelength included in the third wavelength spectrum of the third photo-sensing device.

13. The image sensor of claim 1, wherein differences among external quantum efficiency of the image sensor at a wavelength included in the first wavelength spectrum, external quantum efficiency of the image sensor at a wavelength included in the second wavelength spectrum, and external quantum efficiency of the image sensor at a wavelength included in the third wavelength spectrum is less than or equal to about 50%.

14. The image sensor of claim 1, wherein the third wavelength spectrum includes longer wavelengths than the second wavelength spectrum.

15. The image sensor of claim 1, wherein the first color is green, the second color is blue, and the third color is red.

16. The image sensor of claim 1, wherein
the first photo-sensing device includes
a first electrode and a second electrode facing each other, and
a photoelectric conversion layer between the first electrode and the second electrode.

17. The image sensor of claim 16, further comprising:
an insulation layer between the semiconductor substrate and the first photo-sensing device, and
the first electrode is integrated in the insulation layer.

18. The image sensor of claim 16, wherein
the first photo-sensing device further includes a buffer layer between the first electrode and the photoelectric conversion layer or between the second electrode and the photoelectric conversion layer,
wherein the buffer layer includes a lanthanide element, calcium (Ca), potassium (K), aluminum (Al), or an alloy thereof.

19. An electronic device comprising the image sensor of claim 1.

20. An image sensor, comprising:
a first photo-sensing device integrated in a semiconductor substrate, the first photo-sensing device being configured to sense light of a first wavelength spectrum, and
a second photo-sensing device integrated in the semiconductor substrate, the second photo-sensing device being configured to sense light of a second wavelength spectrum,
wherein the first photo-sensing device and the second photo-sensing device are not overlapped with each other in a thickness direction extending perpendicular to an upper surface of the semiconductor substrate and are spaced apart from each other in a surface direction extending parallel to the upper surface of the semiconductor substrate,
wherein the first photo-sensing device and the second photo-sensing device each include
an upper surface that is proximate to the upper surface of the semiconductor substrate,
a lower surface facing the upper surface and distal from the upper surface of the semiconductor substrate, and
a doped region between the upper surface and the lower surface, wherein the second photo-sensing device has at least one of
the upper surface of the second photo-sensing device being distal from the upper surface of the semiconductor substrate in relation to the upper surface of the first photo-sensing device, or
the doped region of the second photo-sensing device being thicker, in the thickness direction, than the doped region of the first photo-sensing device,
wherein an external quantum efficiency at a wavelength included in the second wavelength spectrum of the second photo-sensing device is different based on a thickness, in the thickness direction, of the doped region of the second photo-sensing device, and
wherein the thickness of the doped region of the second photo-sensing device satisfies Relationship Equation 1:

$$2.5 \times EQE(T_2) \geq EQE(T_1) \quad \text{[Relationship Equation 1]}$$

wherein, in Relationship Equation 1,
EQE ($T_2$) is external quantum efficiency at a wavelength included in the second wavelength spectrum based on the thickness of the doped region of the second photo-sensing device in the thickness direction being a thickness $T_2$,
EQE ($T_1$) is external quantum efficiency at a wavelength included in the first wavelength spectrum based on the thickness of the doped region of the first photo-sensing device in the thickness direction being a thickness $T_1$, and
$T_2 > T_1$.

21. The image sensor of claim 20, further comprising:
a third photo-sensing device on the semiconductor substrate, the third photo-sensing device being configured to sense light of a third wavelength spectrum,
wherein the third photo-sensing device is overlapped with at least one of the first photo-sensing device or the second photo-sensing device in the thickness direction.

22. The image sensor of claim 21, wherein
the third photo-sensing device is overlapped with the first photo-sensing device in the thickness direction, and
the third photo-sensing device is overlapped with the second photo-sensing device in the thickness direction.

23. The image sensor of claim 21, further comprising:
a fourth photo-sensing device on the semiconductor substrate, the fourth photo-sensing device being configured to sense light of a fourth wavelength spectrum,
wherein the fourth photo-sensing device overlaps with the third photo-sensing device in the surface direction,
wherein the third photo-sensing device is overlapped with the first photo-sensing device and is not overlapped with the second photo-sensing device in the thickness direction, and
wherein the fourth photo-sensing device is overlapped with the second photo-sensing device and is not overlapped with the first photo-sensing device in the thickness direction.

24. The image sensor of claim 20, wherein the first photo-sensing device and the second photo-sensing device are at least partially overlapped with each other in the surface direction, such that the lower surface of the first photo-sensing device is equidistant or distal from the upper surface of the semiconductor substrate in relation to the upper surface of the second photo-sensing device.

25. The image sensor of claim 20, wherein the first photo-sensing device and the second photo-sensing device are not overlapped with each other in the surface direction, such that the lower surface of the first photo-sensing device is proximate to the upper surface of the semiconductor substrate in relation to the upper surface of the second photo-sensing device.

26. The image sensor of claim 20, wherein the image sensor does not include any color filter.

27. An electronic device including the image sensor of claim 20.

* * * * *

UNITED STATES PATENT AND TRADEMARK OFFICE
CERTIFICATE OF CORRECTION

| | | |
|---|---|---|
| PATENT NO. | : 11,616,092 B2 | Page 1 of 1 |
| APPLICATION NO. | : 17/097329 | |
| DATED | : March 28, 2023 | |
| INVENTOR(S) | : Kyung Bae Park et al. | |

It is certified that error appears in the above-identified patent and that said Letters Patent is hereby corrected as shown below:

On the Title Page

Item (72) Inventors should read:
Kyung Bae Park, Hwaseong-si (KR); Yong Wan Jin, Seoul (KR); Sung Young Yun, Suwon-si (KR); Sung Jun Park, Yongin-si (KR); Feifei Fang, Suwon-si (KR); Chul Joon Heo, Busan (KR)

Signed and Sealed this
Twentieth Day of August, 2024

Katherine Kelly Vidal
*Director of the United States Patent and Trademark Office*